United States Patent
Kurihara

(10) Patent No.: US 12,034,019 B2
(45) Date of Patent: Jul. 9, 2024

(54) LIGHT RECEIVING ELEMENT, SOLID-STATE IMAGING DEVICE, AND ELECTRONIC DEVICE

(71) Applicant: SONY SEMICONDUCTOR SOLUTIONS CORPORATION, Kanagawa (JP)

(72) Inventor: Shinichiro Kurihara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/998,520

(22) PCT Filed: Apr. 6, 2021

(86) PCT No.: PCT/JP2021/014626
§ 371 (c)(1),
(2) Date: Nov. 11, 2022

(87) PCT Pub. No.: WO2021/241010
PCT Pub. Date: Dec. 2, 2021

(65) Prior Publication Data
US 2023/0246042 A1    Aug. 3, 2023

(30) Foreign Application Priority Data
May 25, 2020 (JP) .................................. 2020-090535

(51) Int. Cl.
*H01L 27/146* (2006.01)
(52) U.S. Cl.
CPC .. *H01L 27/14614* (2013.01); *H01L 27/14603* (2013.01); *H01L 27/14627* (2013.01)
(58) Field of Classification Search
CPC ......... H01L 27/14614; H01L 27/14603; H01L 27/14627
See application file for complete search history.

(56) References Cited

U.S. PATENT DOCUMENTS 10,797,091 B2 * 10/2020 Takahashi ........... H01L 27/1464
2018/0019272 A1    1/2018 Gaebler et al.
(Continued)

FOREIGN PATENT DOCUMENTS

JP    2011-049446 A    3/2011
JP    2011-159758 A    8/2011
(Continued)

OTHER PUBLICATIONS

International Search Report and Written Opinion of PCT Application No. PCT/JP2021/014626, dated Jul. 6, 2021, 12 pages of ISRWO.

*Primary Examiner* — Tony Ko
(74) *Attorney, Agent, or Firm* — CHIP LAW GROUP

(57) ABSTRACT

Provided is a light-receiving element having a structure in which a floating diffusion region is surrounded by transfer gate electrodes in a single photoelectric conversion region constituting a pixel, the structure making it possible to improve optical symmetry and to extract light efficiently. The light-receiving element comprises: a photoelectric conversion region constituting a pixel; a floating diffusion region of a first electrical conductivity type provided on one main surface side of the photoelectric conversion region; and a plurality of transfer gate electrodes which are provided on the one main surface side of the photoelectric conversion region and are spaced apart from each other with a gate insulating film therebetween, the plurality of transfer gate electrodes being provided symmetrically about the floating diffusion region in a planar pattern.

16 Claims, 19 Drawing Sheets

(56) References Cited

U.S. PATENT DOCUMENTS

2019/0296060 A1 9/2019 Oh
2019/0296075 A1 9/2019 Oh

FOREIGN PATENT DOCUMENTS

| JP | 2012-164971 A | 8/2012 |
| JP | 2013-125861 A | 6/2013 |
| JP | 2014-187270 A | 10/2014 |
| JP | 2014-225536 A | 12/2014 |
| JP | 2020-005131 A | 1/2020 |
| WO | 2013/118646 A1 | 8/2013 |
| WO | 2016/158439 A1 | 10/2016 |
| WO | 2018/207340 A1 | 11/2018 |
| WO | 2020/095689 A1 | 5/2020 |

\* cited by examiner

LIGHT RECEIVING ELEMENT, SOLID-STATE IMAGING DEVICE, AND ELECTRONIC DEVICE

CROSS REFERENCE TO RELATED APPLICATIONS

This application is a U.S. National Phase of International Patent Application No. PCT/JP2021/014626 filed on Apr. 6, 2021, which claims priority benefit of Japanese Patent Application No. JP 2020-090535 filed in the Japan Patent Office on May 25, 2020. Each of the above-referenced applications is hereby incorporated herein by reference in its entirety.

TECHNICAL FIELD

The technology according to the present disclosure (present technology) relates to a light receiving element, a solid-state imaging device, and an electronic device.

BACKGROUND ART

As a conventional solid-state imaging device, there is known a structure including a floating diffusion region provided at the center of a single photoelectric conversion region (photodiode region) that constitutes a pixel and a transfer gate electrode, closed in an annular shape, of the transfer transistor provided at the periphery of the floating diffusion region (see Patent Document 1). According to the structure, the distance between the peripheral edge portion of the photoelectric conversion region and the transfer gate electrode is shortened. Therefore, transfer efficiency of signal charges can be improved. Moreover, the area of the photoelectric conversion region is easily expanded, so that the sensitivity and the saturation signal charge amount can be improved.

CITATION LIST

Patent Document

Patent Document 1: Japanese Patent Application Laid-Open No. 2011-49446

SUMMARY OF THE INVENTION

Problems to be Solved by the Invention

In the solid-state imaging device described in Patent Document 1, the transfer gate electrode closed in an annular shape surrounds the periphery of the floating diffusion region. Accordingly, a well region provided at the periphery of the floating diffusion region is difficult to be taken out, so that the potential of the well region is difficult to be fixed. In view of the above, it is conceivable that a portion of the transfer gate electrode closed in an annular shape is cut out, and the well region is taken out through the cutout portion. However, when a portion of the transfer gate electrode closed in an annular shape is cut out, optical symmetry is reduced. Accordingly, there is a case where it is difficult to extract light efficiently.

An object of the present technology is to provide a light receiving element, a solid-state imaging device, and an electronic device that can improve optical symmetry and can extract light efficiently in a structure in which, in a single photoelectric conversion region that constitutes a pixel, a transfer gate electrode surrounds the periphery of a floating diffusion region.

Solutions to Problems

A light receiving element according to an aspect of the present technology is summarized to include: a photoelectric conversion region that constitutes a pixel; a floating diffusion region of a first conductivity type that is provided on one main surface side of the photoelectric conversion region; and a plurality of transfer gate electrodes that is provided to be spaced apart from each other on one main surface of the photoelectric conversion region with a gate insulating film interposed between the photoelectric conversion region and the plurality of transfer gate electrodes, the plurality of transfer gate electrodes being provided symmetrically about the floating diffusion region on a planar pattern.

A solid-state imaging device according to an aspect of the present technology is summarized to include a pixel region that includes a plurality of pixels arrayed in a matrix, in which each of the pixels includes: a photoelectric conversion region; a floating diffusion region of a first conductivity type that is provided on one main surface side of the photoelectric conversion region; and a plurality of transfer gate electrodes that is provided to be spaced apart from each other on one main surface of the photoelectric conversion region with a gate insulating film interposed between the photoelectric conversion region and the plurality of transfer gate electrodes, the plurality of transfer gate electrodes being provided symmetrically about the floating diffusion region on a planar pattern.

An electronic device according to an aspect of the present technology is summarized to include: a solid-state imaging device that includes a pixel region including a plurality of pixels arrayed in a matrix; and a signal processing circuit that processes an output signal of the solid-state imaging device, in which each of the pixels includes: a photoelectric conversion region; a floating diffusion region of a first conductivity type that is provided on one main surface side of the photoelectric conversion region; and a plurality of transfer gate electrodes that is provided to be spaced apart from each other on one main surface of the photoelectric conversion region with a gate insulating film interposed between the photoelectric conversion region and the plurality of transfer gate electrodes, the plurality of transfer gate electrodes being provided symmetrically about the floating diffusion region on a planar pattern.

MODE FOR CARRYING OUT THE INVENTION

Figure 1:
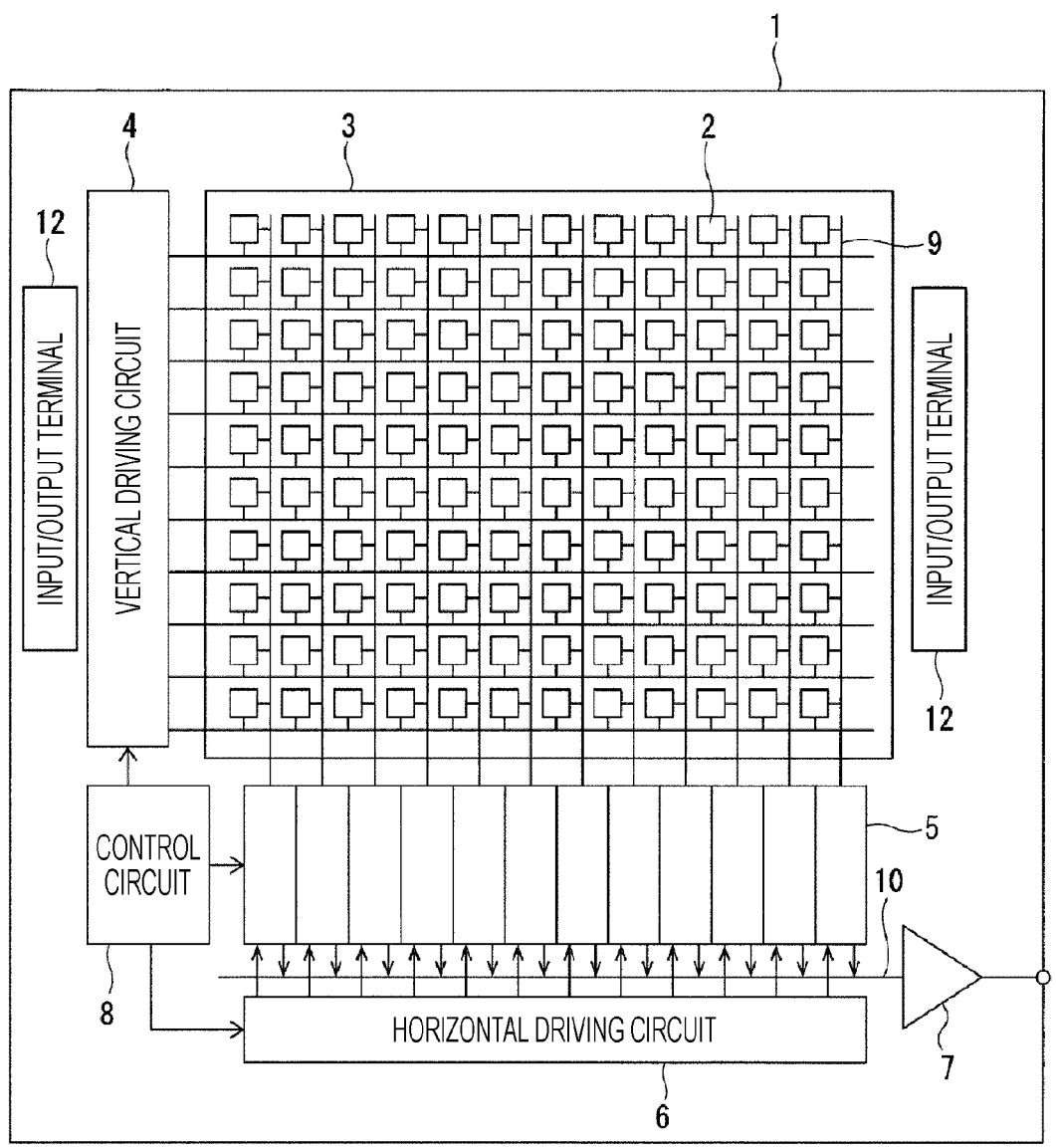
FIG. 1 is a block diagram of a solid-state imaging device according to a first embodiment.

Hereinafter, first to sixth embodiments of the present technology will be described with reference to the drawings. Reference will be made in the following description. In the description of the drawings, the same or similar portions are denoted by the same or similar reference numerals. However, it should be noted that the drawings are schematic, and the relationship between the thickness and the plane dimension, the ratio of the thickness of each layer, and the like are different from actual ones. Therefore, specific thicknesses and dimensions should be determined in consideration of the following description. Furthermore, it is needless to say that portions having different dimensional relationships and ratios from each other are included between the drawings. Note that the advantageous effects described in the present specification are merely provided as examples and are not limited, and there may be other advantageous effects.

In the present specification, a "first conductivity type" means one of a p-type or an n-type, and a "second conductivity type" means one of a p-type or an n-type different from the "first conductivity type". Furthermore, "+" or "−" added to "n" or "p" means that the impurity concentration of a semiconductor region is relatively higher or lower than that of a semiconductor region to which "+" and "−" are not added. However, even in the semiconductor regions to which the same "n" and "n" are added, they do not mean that the impurity concentrations of the respective semiconductor regions are exactly the same.

In the present specification, definitions of directions such as "up" and "down" are just definitions for convenience of description, and do not limit the technical idea of the present technology. For example, it is needless to say that if an object is rotated by 90 degrees and observed, "up" and "down" are converted into and read as "left" and "right", and if the object is rotated by 180 degrees and observed, "up" and "down" are inverted and read.

First Embodiment

<Example of Schematic Configuration of Solid-State Imaging Device>

A complementary metal oxide semiconductor (CMOS) image sensor will be described as an example of a solid-state imaging device according to a first embodiment. As depicted in FIG. 1, the solid-state imaging device according to the first embodiment includes a pixel region (imaging region) 3 in which pixels 2 are arrayed in a matrix, and peripheral circuit sections (4, 5, 6, 7, and 8) that process pixel signals output from the pixel region 3.

The pixel 2 generally includes a photoelectric conversion region including a photodiode that photo-electrically converts incident light, and a plurality of pixel transistors for reading out signal charges generated by photoelectric conversion of the photoelectric conversion region. The plurality of pixel transistors can include, for example, three transistors of a transfer transistor, a reset transistor, and an amplification transistor. The plurality of pixel transistors can include four transistors by further adding a selection transistor.

The peripheral circuit sections (4, 5, 6, 7, and 8) include a vertical driving circuit 4, column signal processing circuits 5, a horizontal driving circuit 6, an output circuit 7, and a control circuit 8. The control circuit 8 receives an input clock and data for instructing operation modes and the like, and outputs data of internal information and the like of the solid-state imaging device. For example, the control circuit 8 generates a clock signal and a control signal as references for operation of the vertical driving circuit 4, the column signal processing circuits 5, the horizontal driving circuit 6, and the like on the basis of a vertical synchronization signal, a horizontal synchronization signal, and a master clock. The control circuit 8 outputs the generated clock signal and control signal to the vertical driving circuit 4, the column signal processing circuits 5, the horizontal driving circuit 6, and the like.

The vertical driving circuit 4 includes, for example, a shift register. The vertical driving circuit 4 selects a pixel driving wiring line, and supplies a pulse for driving the pixels 2 to the selected pixel driving wiring line to drive the pixels 2 in the unit of row. For example, the vertical driving circuit 4 selectively scans each pixel 2 of the pixel region 3 sequentially in a vertical direction in the unit of row and supplies a pixel signal to the column signal processing circuits 5 through vertical signal lines 9. The pixel signal is based on signal charges generated corresponding to the amount of light received by, for example, a photodiode as a photoelectric conversion region of each pixel 2.

The column signal processing circuit 5 is arranged, for example, for each column of pixels 2. The column signal processing circuit 5 performs, for signals output from pixels 2 of one row, a signal process such as noise removal for each pixel column. For example, the column signal processing circuit 5 performs a signal process such as CDS for removing fixed pattern noise inherent to the pixels 2, signal amplification, and AD conversion. A horizontal selection switch (not depicted) is provided at an output stage of the column signal processing circuit 5 so as to be connected between the column signal processing circuit 5 and a horizontal signal line 10.

The horizontal driving circuit 6 includes, for example, a shift register. The horizontal driving circuit 6 selects each of the column signal processing circuits 5 in sequence by sequentially outputting horizontal scan pulses, and makes each of the column signal processing circuits 5 output pixel signals to the horizontal signal line 10.

The output circuit 7 performs a signal process for the signals sequentially supplied from each of the column signal processing circuits 5 through the horizontal signal line 10, and outputs the processed signals. For example, the output circuit 7 may perform only buffering, or may perform black level adjustment, column variation correction, various types of digital signal processes, and the like. Input/output terminals 12 exchange signals with the outside.

In FIG. 1, the pixel region 3 and the peripheral circuit sections (4, 5, 6, 7, and 8) of the solid-state imaging device according to the first embodiment are formed on one substrate 1, but may be formed in a stacked structure in which a plurality of substrates is bonded. For example, the solid-state imaging device according to the first embodiment may include first and second substrates, the photoelectric conversion region and the pixel transistors may be provided on the first substrate, and peripheral circuits (3, 4, 5, 6, and 7) and the like may be provided on the second substrate. An alternative configuration may be adopted in which the photoelectric conversion region and some of the pixel transistors are provided on the first substrate, and some of the remaining pixel transistors, the peripheral circuits (3, 4, 5, 6, and 7), and the like are provided on the second substrate.

Figure 2:
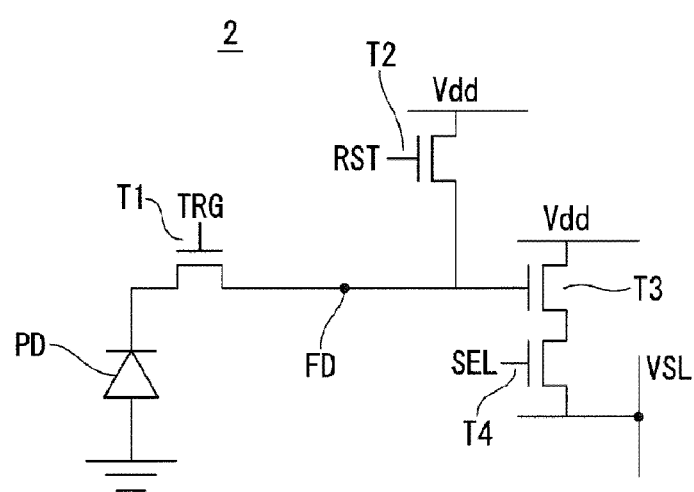
FIG. 2 is an equivalent circuit diagram of a pixel according to the first embodiment.

FIG. 2 depicts an example of an equivalent circuit of the pixel 2 of the solid-state imaging device according to the first embodiment. As depicted in FIG. 2, the anode of a photodiode PD that is the photoelectric conversion region of the pixel 2 is grounded, and the cathode of the photodiode PD is connected with the source of a transfer transistor T1 that is an active element. The drain of the transfer transistor T1 is connected with a floating diffusion region (floating diffusion region) FD. The floating diffusion region FD is connected to the source of a reset transistor T2 that is an active element and the gate of an amplification transistor T3 that is an active element. The source of the amplification transistor T3 is connected to the drain of a selection transistor T4 that is an active element, and the drain of the amplification transistor T3 is connected to a power supply Vdd. The source of the selection transistor T4 is connected to a vertical signal line VSL. The drain of the reset transistor T2 is connected to a power supply Vdd.

During operation of the solid-state imaging device according to the first embodiment, a control potential TRG is applied to the transfer transistor T1, and signal charges generated by the photodiode PD are transferred to the floating diffusion region FD. The signal charges transferred to the floating diffusion region FD are read out and applied to the gate of the amplification transistor T3. A selection signal SEL for the horizontal line is given from a vertical shift register to the gate of the selection transistor T4. By setting the selection signal SEL to a high (H) level, the selection transistor T4 is conducted, and a current corresponding to the potential of the floating diffusion region FD amplified by the amplification transistor T3 flows through the vertical signal line VSL. Furthermore, by setting the reset signal RST applied to the gate of the reset transistor T2 to a high (H) level, the reset transistor T2 is conducted, and the signal charges accumulated in the floating diffusion region FD are reset.

<Example of Schematic Configuration of Pixel>

Figure 3:
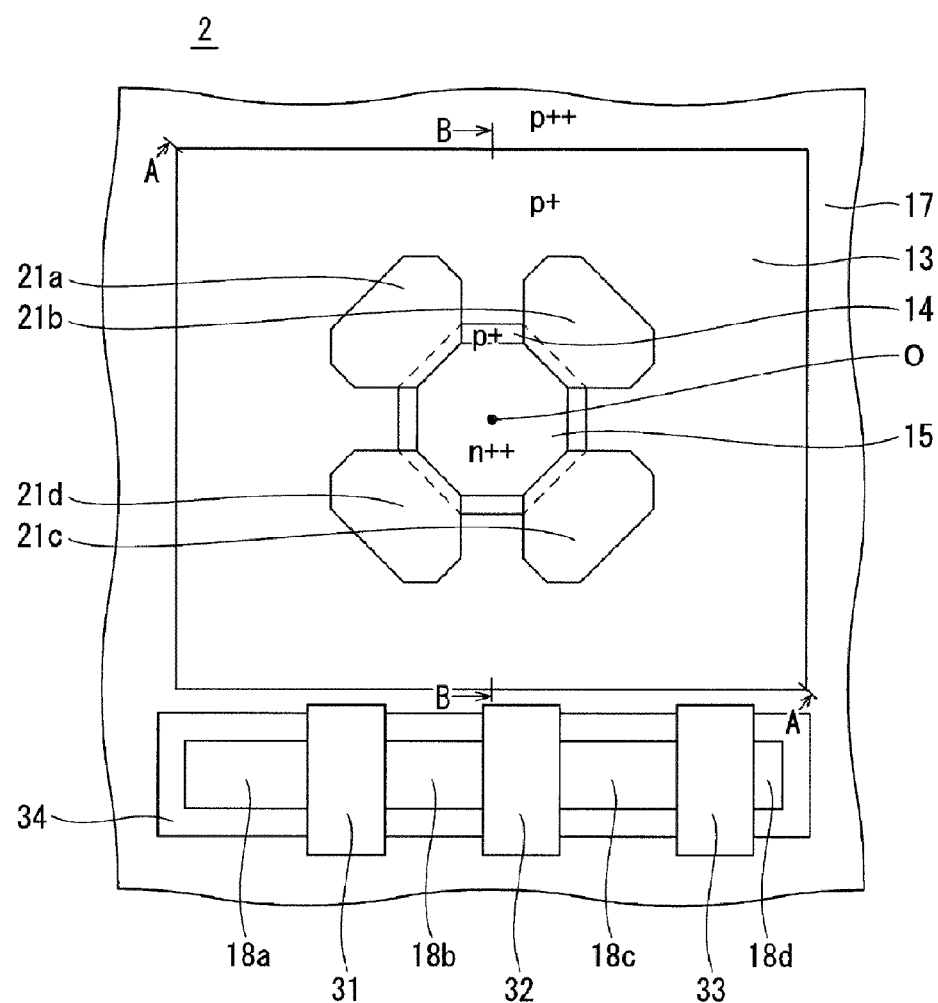
FIG. 3 is a plan view of a pixel according to the first embodiment.
Figure 4:
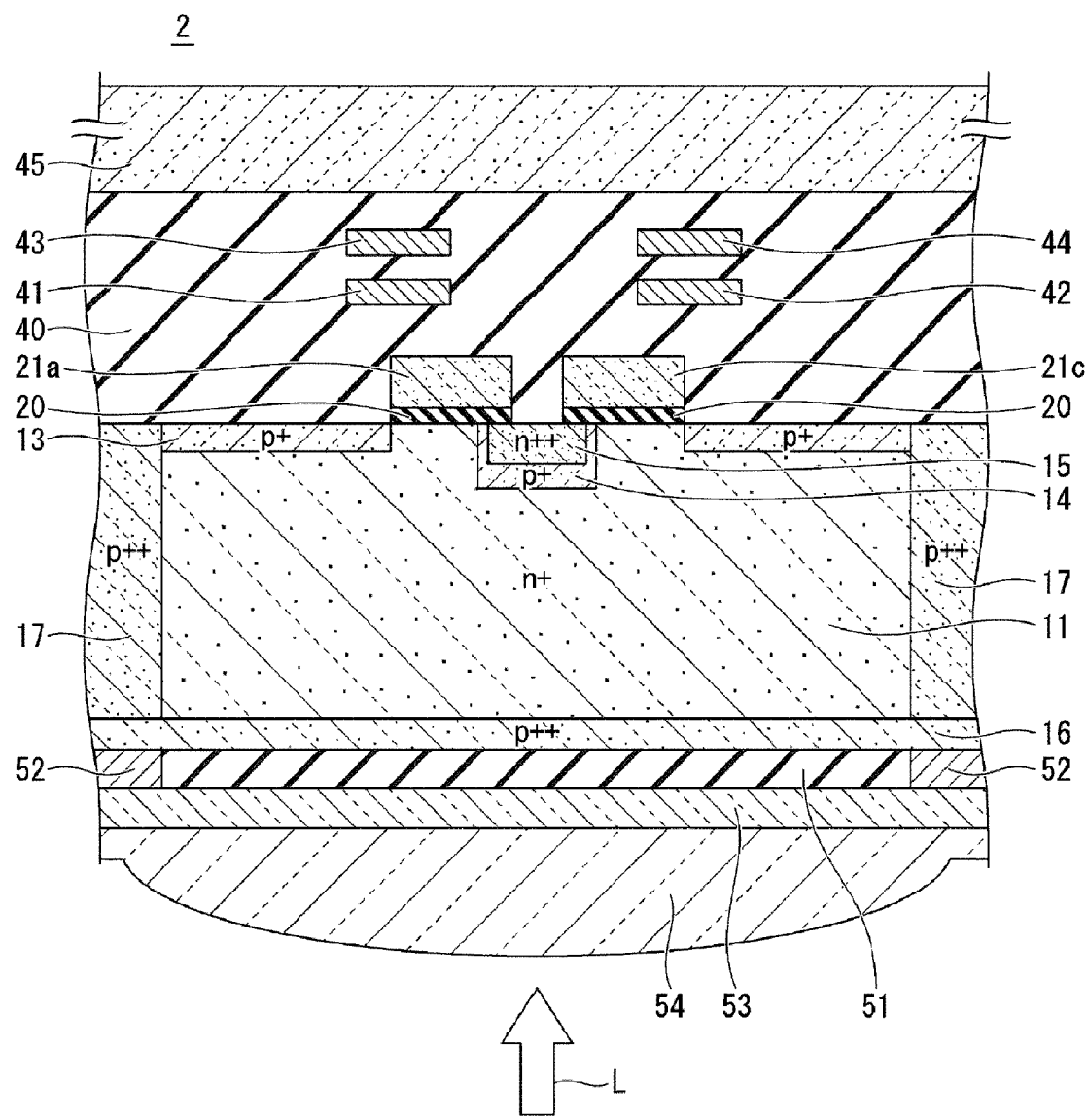
FIG. 4 is a cross-sectional view as viewed in direction A-A in FIG. 3.
Figure 5:
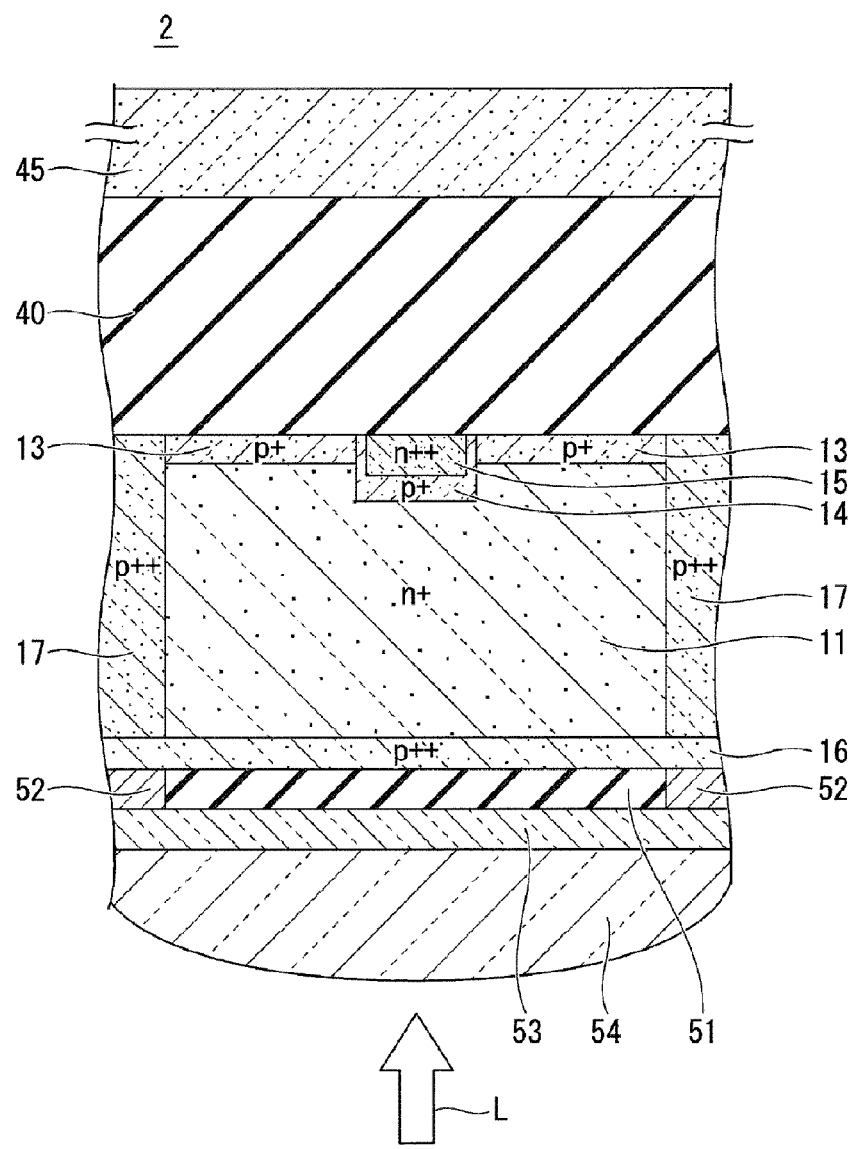
FIG. 5 is a cross-sectional view as viewed in direction B-B in FIG. 3.

FIG. 3 depicts a schematic planar layout of the pixel 2 depicted in FIG. 1. The pixels 2 depicted in FIG. 3 are arrayed in a matrix to constitute the entire pixel region 3 depicted in FIG. 1. FIG. 4 depicts a cross section as viewed in direction A-A in FIG. 3, and FIG. 5 depicts a cross section as viewed in direction B-B in FIG. 3. As depicted in FIGS. 4 and 5, a so-called backside illumination solid-state imaging device is illustrated as the solid-state imaging device according to the first embodiment. Hereinafter, a surface (one main surface) of each member of the solid-state imaging device according to the first embodiment on an incident surface side (lower side in FIGS. 4 and 5) of light L is referred to as a "back surface", and a surface (the other main surface) of each member of the solid-state imaging device according to the first embodiment on a side opposite to the incident surface side of the light L (upper side in FIGS. 4 and 5) is referred to as a "front surface".

As illustrated in FIGS. 4 and 5, the solid-state imaging device according to the first embodiment includes a semiconductor region 11 of a first conductivity type ($n^+$ type). As a semiconductor material constituting the semiconductor region 11, for example, silicon (Si) or a compound semiconductor can be used. As the compound semiconductor, for example, indium gallium arsenide (InGaAs), indium gallium arsenide phosphide (InGaAsP), indium arsenide antimony (InAsSb), indium gallium phosphide (InGaP), gallium arsenide antimony (GaAsSb) and indium aluminum arsenide (InAlAs), gallium nitride (GaN), silicon carbide (SiC), silicon germanium (SiGe), and the like can be named.

A well region 14 of a second conductivity type ($p^+$ type) is provided in a portion (upper portion) of the front surface side of the semiconductor region 11. A floating diffusion region 15 of a first conductivity type ($n^{++}$ type) having a higher impurity concentration than the semiconductor region 11 is provided in a portion (upper portion) of the front surface side of the well region 14 so as to be in contact with the well region 14. The side surface and the bottom surface of the floating diffusion region 15 are covered with the well region 14. The well region 14 has a function of blocking signal charges flowing from the semiconductor region 11 below the floating diffusion region 15 to the floating diffusion region 15.

A semiconductor region 13 of a second conductivity type ($p^+$ type) is provided in a portion (upper portion) of the front surface side of the semiconductor region 11 so as to be in contact with the semiconductor region 11. The semiconductor region 13 is spaced apart from the well region 14 in FIG. 4, but in contact with the well region 14 in FIG. 5. The depth of the semiconductor region 13 is shallower than the depth of the well region 14. The pn junction between the $p^+$-type semiconductor region 13 and the $n^+$-type semiconductor region 11 constitutes a photodiode that is a photoelectric conversion region. The semiconductor region 13 also has a function of suppressing a dark current.

The semiconductor region 11 is provided with an element isolation region 17 of a second conductivity type ($p^{++}$ type). As depicted in FIG. 3, the element isolation region 17 defines the peripheral portion of the $p^+$-type semiconductor region 13. A region inside a rectangular planar pattern that is the outer shape of the semiconductor region 13 is defined as a photoelectric conversion region (photodiode region).

The floating diffusion region 15 is provided at a position of a center (center of gravity) O of the photoelectric conversion region on the planar pattern. Note that the arrangement position of the floating diffusion region 15 is not necessarily positioned at the center O of the photoelectric conversion region, and the floating diffusion region 15 may be provided at a position shifted from the center O of the photoelectric conversion region. The floating diffusion region 15 has a planar pattern having symmetry about the center O of the photoelectric conversion region. In FIG. 3, the floating diffusion region 15 has an octagonal planar pattern. The shape of the planar pattern of the floating diffusion region 15 is not limited thereto, and may be, for example, a polygon such as a rectangle or a hexagon, or may be a circle.

The well region 14 is provided so as to surround the periphery of the floating diffusion region 15. The outer shape of the well region 14 has a planar pattern having symmetry about the floating diffusion region 15. In FIG. 3, the outer shape of the well region 14 has an octagonal planar pattern. Note that the outer shape of the well region 14 is not limited thereto, and may be, for example, a polygon such as a rectangle or a hexagon, or may be a circle.

As depicted in FIGS. 3 and 4, a plurality of transfer gate electrodes 21a to 21d is provided on the front surface of the semiconductor region 11 with a gate insulating film 20 interposed therebetween. As a material of the gate insulating film 20, a single layer film of any one of a silicon oxide film ($SiO_2$ film), a silicon oxynitride film (SiON film), a strontium oxide film (SrO film), a silicon nitride film ($Si_3N_4$ film), an aluminum oxide film ($Al_2O_3$ film), a magnesium oxide film (MgO film), an yttrium oxide film ($Y_2O_3$ film), a hafnium oxide film ($HfO_2$ film), a zirconium oxide film ($ZrO_2$ film), a tantalum oxide film ($Ta_2O_5$ film), and a bismuth oxide film ($Bi_2O_3$ film), or a composite film obtained by stacking a plurality of these films, or the like can be used. As a material of the transfer gate electrodes 21a to 21d, for example, polysilicon (doped polysilicon) into which a high-concentration n-type impurity is introduced can be used.

As depicted in FIG. 3, the plurality of transfer gate electrodes 21a to 21d is arranged to be spaced apart from each other. The plurality of transfer gate electrodes 21a to 21d is arranged symmetrically about the floating diffusion region 15, and in four-fold symmetry. In other words, the plurality of transfer gate electrodes 21a to 21d can also be regarded as a structure in which a transfer gate electrode closed in an annular shape surrounding the periphery of the floating diffusion region 15 is divided into a plurality of portions. In FIG. 3, the planar patterns of the transfer gate electrodes 21a to 21d are an octagon, but are not limited thereto, and may be a rectangle, or may be an arc shape, for example.

As depicted in FIGS. 3 and 4, the semiconductor region 13 is not arranged immediately below the plurality of transfer gate electrodes 21a to 21d, and the semiconductor region 11 is exposed on the front surface side of the semiconductor substrate. The semiconductor region 13 is in contact with the well region 14 through between the plurality of transfer gate electrodes 21a to 21d on the planar pattern.

As depicted in FIG. 3, diffusion regions 18a to 18d are provided in the vicinity of the photoelectric conversion region defined by the outer shape of the $p^+$-type semiconductor region 13 with the element isolation region 17 and an element isolation insulating film 34 interposed therebetween. A gate electrode 31 of the reset transistor is provided on a front surface of the semiconductor substrate between the diffusion regions 18a and 18b with a gate insulating film not depicted interposed therebetween. A gate electrode 32 of the amplification transistor is provided on the front surface of the semiconductor substrate between the diffusion regions 18b and 18c with the gate insulating film not depicted interposed therebetween. A gate electrode 33 of the selection transistor is provided on the front surface of the semiconductor substrate between the diffusion regions 18c and 18d with the gate insulating film not depicted interposed therebetween.

The peripheries of the diffusion regions 18a to 18d are electrically element-isolated from each other by the element isolation insulating film 34. The element isolation insulating film 34 includes, for example, an insulating film embedded in a trench formed in the semiconductor region 11. The element isolation insulating film 34 may include, for example, a single layer film such as a silicon nitride ($Si_3N_4$) film, an aluminum oxide ($Al_2O_3$) film, a silicon oxide ($SiO_2$) film, a silicon oxynitride (SiON) film, an aluminum oxynitride (AlON) film, a silicon aluminum nitride (SiAlN) film, a magnesium oxide (MgO) film, an aluminum silicon oxide (AlSiO) film, a hafnium oxide ($HfO_2$) film, a hafnium aluminum oxide (HfAlO) film, a tantalum oxide ($Ta_2O_3$) film, a titanium oxide ($TiO_2$) film, a scandium oxide ($Sc_2O_3$) film, a zirconium oxide ($ZrO_2$) film, a gadolinium oxide ($Gd_2O_3$) film, a lanthanum oxide ($La_2O_3$) film, or an yttrium oxide ($Y_2O_3$) film, or a stacked film obtained by stacking a plurality of these films.

Figure 6:
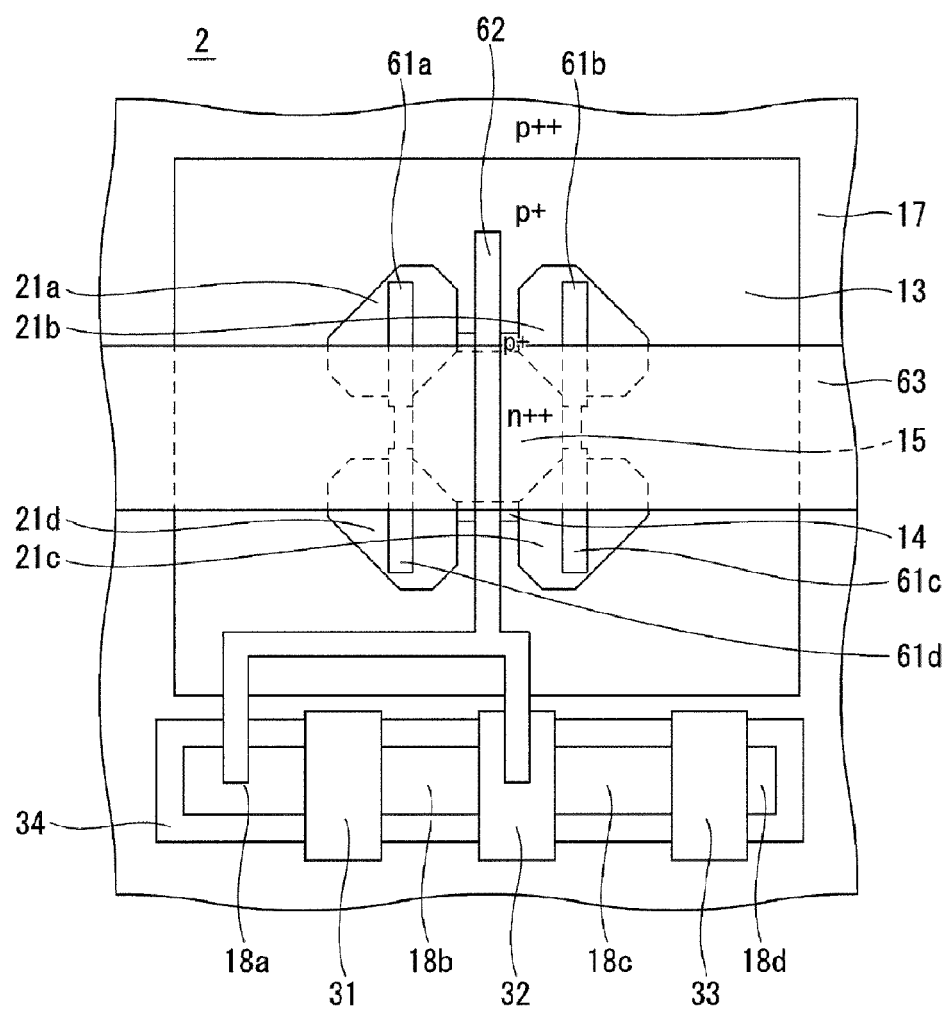
FIG. 6 is another plan view of the pixel according to the first embodiment.

As depicted in FIG. 6, the transfer gate electrodes 21a to 21d are respectively connected with gate wiring lines 61a to 61d arranged in a layer above the transfer gate electrodes 21a to 21d through contacts not depicted. The gate wiring lines 61a to 61d are each connected with a common transfer control wiring line 63 arranged in a layer above the gate wiring lines 61a to 61d through a contact not depicted. A common control potential TRG is applied to the transfer gate electrodes 21a to 21d through the common transfer control wiring line 63 and the gate wiring lines 61a to 61d, and drive control is performed simultaneously.

The floating diffusion region 15 is connected with a readout wiring line 62 arranged in a layer above the floating diffusion region 15 through a contact not depicted. The readout wiring line 62 is connected with each of a diffusion layer 16 and the gate electrode 32 of the amplification transistor through contacts not depicted. Note that the gate wiring lines 61a to 61d, the readout wiring line 62, and the transfer control wiring line 63 in FIG. 6 do not coincide with wiring line layers 41 to 44 depicted in FIG. 4, but schematic arrangements thereof are individually depicted from each other.

As depicted in FIGS. 4 and 5, an interlayer insulating film 40 is arranged on the front surface of the semiconductor region 11 so as to cover the transfer gate electrodes 21a to 21d. In the interlayer insulating film 40, the wiring line layers 41 to 44 for reading out signal charges generated in the photoelectric conversion region are formed. The arrangement position and number of the wiring line layers 41 to 44 are not particularly limited. A support substrate 45 including a Si substrate or the like is arranged on a front surface of the interlayer insulating film 40. The interlayer insulating film 40, the wiring line layers 41 to 44, and the support substrate 45 depicted in FIGS. 4 and 5 are not depicted in FIG. 3.

A semiconductor region 16 of a second conductivity type ($p^{++}$ type) is arranged on the back surface side of the semiconductor region 11. The semiconductor region 16 functions as a photodiode that is a photoelectric conversion region by pn junction with the $n^+$-type semiconductor region 11. Moreover, the semiconductor region 16 has a function of suppressing a dark current.

A light shielding film 52 is arranged on a portion of the back surface side of the semiconductor region 16. The light shielding film 52 is selectively arranged so as to open a light receiving surface of the photoelectric conversion region. As a material of the light shielding film 52, for example, a metal material such as aluminum (Al), tungsten (W), copper (Cu), or chromium (Cr), or a dielectric material such as polysilicon can be adopted.

A planarization film 51 is arranged on the back surface side of the semiconductor region 16 so as to be adjacent to the light shielding film 52. As a material of the planarization film 51, silicon oxide, silicon nitride, silicon oxynitride, organic spin-on glass (SOG), polyimide-based resin, fluorine-based resin, or the like can be used.

A color filter 53 is arranged on the back surface side of the planarization film 51 and the light shielding film 52. A material of the color filter 53 can include an organic material-based material layer using an organic compound such as pigment or dye. The color filter 53 transmits a predetermined wavelength component of the incident light L.

An on-chip lens (microlens) 54 is arranged on the back surface side of the color filter 53. The on-chip lens 54 condenses the light L that is introduced therein. As a material of the on-chip lens 54, for example, an insulating material such as silicon oxide, silicon nitride, silicon oxynitride, organic SOG, polyimide-based resin, or fluorine-based resin can be used.

Next, operation at the time of charge accumulation and signal readout of the solid-state imaging device according to the first embodiment will be described with reference to FIGS. 3 to 5. The solid-state imaging device according to the first embodiment is of a backside illumination type. Accordingly, light L is introduced from an on-chip lens 54 side. The introduced light L is transmitted through the on-chip lens 54, the color filter 53, and the planarization film 51, and is introduced into the photoelectric conversion region. The photoelectric conversion region photo-electrically converts the introduced light L, and generates signal charges (here, electrons) corresponding to the amount of the light.

At the time of charge accumulation, a negative voltage is applied to the transfer gate electrodes 21a to 21d. Therefore, the front surface of the semiconductor region 11 immediately below the transfer gate electrodes 21a to 21d is brought into a hole pinning state, and the signal charges are not transferred to the floating diffusion region 15. Thereupon, a ground potential is applied to the semiconductor region 13 through a substrate contact (not depicted) arranged on the front surface side of the semiconductor region 13, and the potential of the semiconductor region 13 is fixed. Furthermore, the well region 14 is in contact with the semiconductor region 13. Accordingly, the potential of the well region 14 is also fixed via the semiconductor region 13.

On the other hand, at the time of signal readout, a positive voltage is applied to the transfer gate electrodes 21a to 21d. Therefore, potentials of the semiconductor region 13 and the well region 14 immediately below the transfer gate electrodes 21a to 21d are modulated to form a channel region, and signal charges are transferred to the floating diffusion region 15 via the channel region. Thereupon, a ground potential is applied to the semiconductor region 13 through the substrate contact (not depicted) arranged on the front surface side of the semiconductor region 13, and potentials of the semiconductor region 13 and the well region 14 are fixed.

Next, an example of a method of manufacturing the solid-state imaging device according to the first embodiment will be described with reference to FIGS. 3 to 5. First, a semiconductor substrate of a first conductivity type ($n^+$ type) is prepared, and the $p^{++}$-type element isolation region 17 is selectively formed by a photolithography technology and ion implantation. Next, the plurality of transfer gate electrodes 21a to 21d is formed on the front surface side of the semiconductor substrate with the gate insulating film 20 interposed therebetween by using a photolithography technology and an etching technology.

Next, p-type impurity ions are sequentially implanted while changing the projection range by using the transfer gate electrodes 21a to 21d as masks for ion implantation. Thereafter, the impurity ions are diffused and activated by performing heat treatment to form the $p^+$-type semiconductor region 13 and the $p^+$-type well region 14 in a self-aligned manner. Moreover, although not depicted, side wall insulating films (side walls) are formed on the side walls of the transfer gate electrodes 21a to 21d. Then, n-type impurity ions are implanted by using the transfer gate electrodes 21a to 21d and the side wall insulating films as masks for ion implantation. Thereafter, the impurity ions are diffused and activated by performing heat treatment to form the $n^{++}$-type floating diffusion region 15 in a self-aligned manner.

Next, the wiring line layers 41 to 44 are formed on the front surface side of the semiconductor substrate with the interlayer insulating film 40 interposed therebetween by using a chemical vapor deposition (CVD) method or the like. Next, the support substrate 45 is bonded to the front surface side of the interlayer insulating film 40, and the back surface of the semiconductor substrate is ground and polished to reduce the film thickness. Next, p impurity ions are implanted into the back surface side of the semiconductor substrate, and the $p^{++}$-type semiconductor region 16 is formed by performing heat treatment. Next, the light shielding film 52, the planarization film 51, the color filter 53, and the on-chip lens 54 are sequentially formed on the back surface side of the semiconductor region 16 by using a CVD method or the like. Note that the method of manufacturing the solid-state imaging device according to the first embodiment is not particularly limited, and the solid-state imaging device according to the first embodiment can be implemented by various manufacturing methods.

<Operation and Advantageous Effects by First Embodiment>

According to the solid-state imaging device of the first embodiment, the floating diffusion region 15 is arranged in the vicinity of the center C of the photoelectric conversion region, and the plurality of transfer gate electrodes 21a to 21d is arranged so as to surround the periphery of the floating diffusion region 15. Therefore, the distance from the peripheral edge portion of the photoelectric conversion region to the floating diffusion region 15 can be shortened, so that the transfer efficiency of the signal charges can be improved. Moreover, the photoelectric conversion region can be efficiently expanded, so that the sensitivity and the saturation signal charge amount can be improved.

Moreover, the plurality of transfer gate electrodes 21a to 21d is spaced apart from each other. Accordingly, the $p^+$-type well region 14 that surrounds the periphery of the floating diffusion region 15 is taken out through between the plurality of transfer gate electrodes 21a to 21d and is connected to the $p^+$-type semiconductor region 13, so that the ground potential can be applied via the semiconductor region 13. Accordingly, a structure for taking out the $p^+$-type well region 14 such as constructing a p-type semiconductor region immediately below the transfer gate electrodes is unnecessary as compared with a structure in which the periphery of the floating diffusion region 15 is surrounded by the transfer gate electrode having closed annular shape, so that deterioration of transfer characteristics can be suppressed.

Moreover, the plurality of transfer gate electrodes 21a to 21d is arranged symmetrically about the floating diffusion region 15. Accordingly, optical symmetry such as reflection from the back surface side of the plurality of transfer gate electrodes 21a to 21d and reflection from the back surface side of the wiring line layers 41 to 44 can be improved, so that light can be efficiently extracted. Furthermore, when ion implantation is performed in a self-aligned manner using the plurality of transfer gate electrodes 21a to 21d as masks for ion implantation, it becomes easy to perform ion implantation separately, so that implantation variations can be reduced.

Note that a so-called backside illumination solid-state imaging device has been illustrated as the solid-state imaging device according to the first embodiment, but the solid-state imaging device can also be applied to a so-called frontside illumination solid-state imaging device. In a case of the frontside illumination solid-state imaging device, a structure is adopted in which the color filter and the on-chip lens are provided on the front surface side of the interlayer insulating film constituting a multilayer wiring line structure provided on the front surface side of the photoelectric conversion region, and it is sufficient if light is introduced into the front surface side of the photoelectric conversion region via the multilayer wiring line structure.

Second Embodiment

In the solid-state imaging device according to the first embodiment depicted in FIG. 3, the single on-chip lens 54 is provided in a single photoelectric conversion region, and the light L condensed by the on-chip lens 54 is concentrated immediately below the floating diffusion region 15. Accordingly, photoelectric conversion is likely to be performed even in the floating diffusion region 15, and there is a case in which noise due to a decrease in dynamic range or variation in condensation of light increases.

Figure 7:
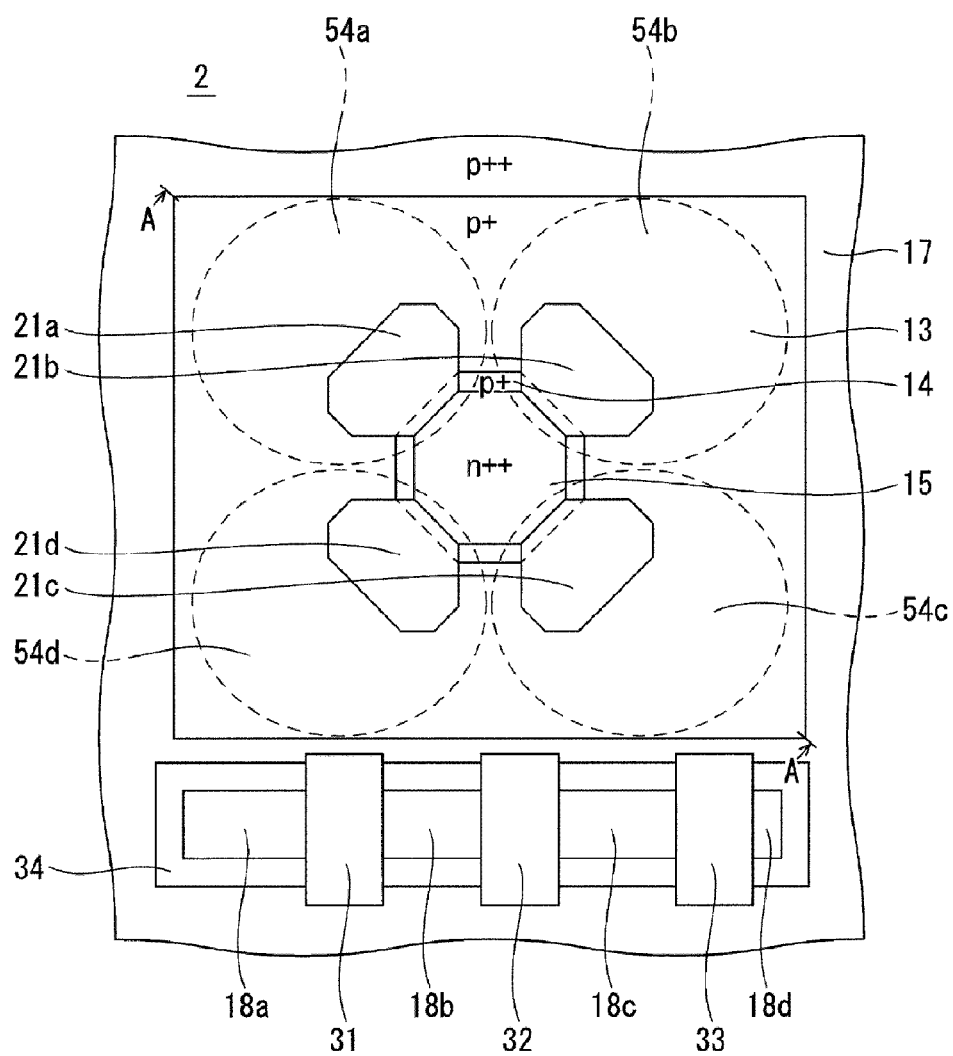
FIG. 7 is a plan view of a pixel according to a second embodiment.
Figure 8:
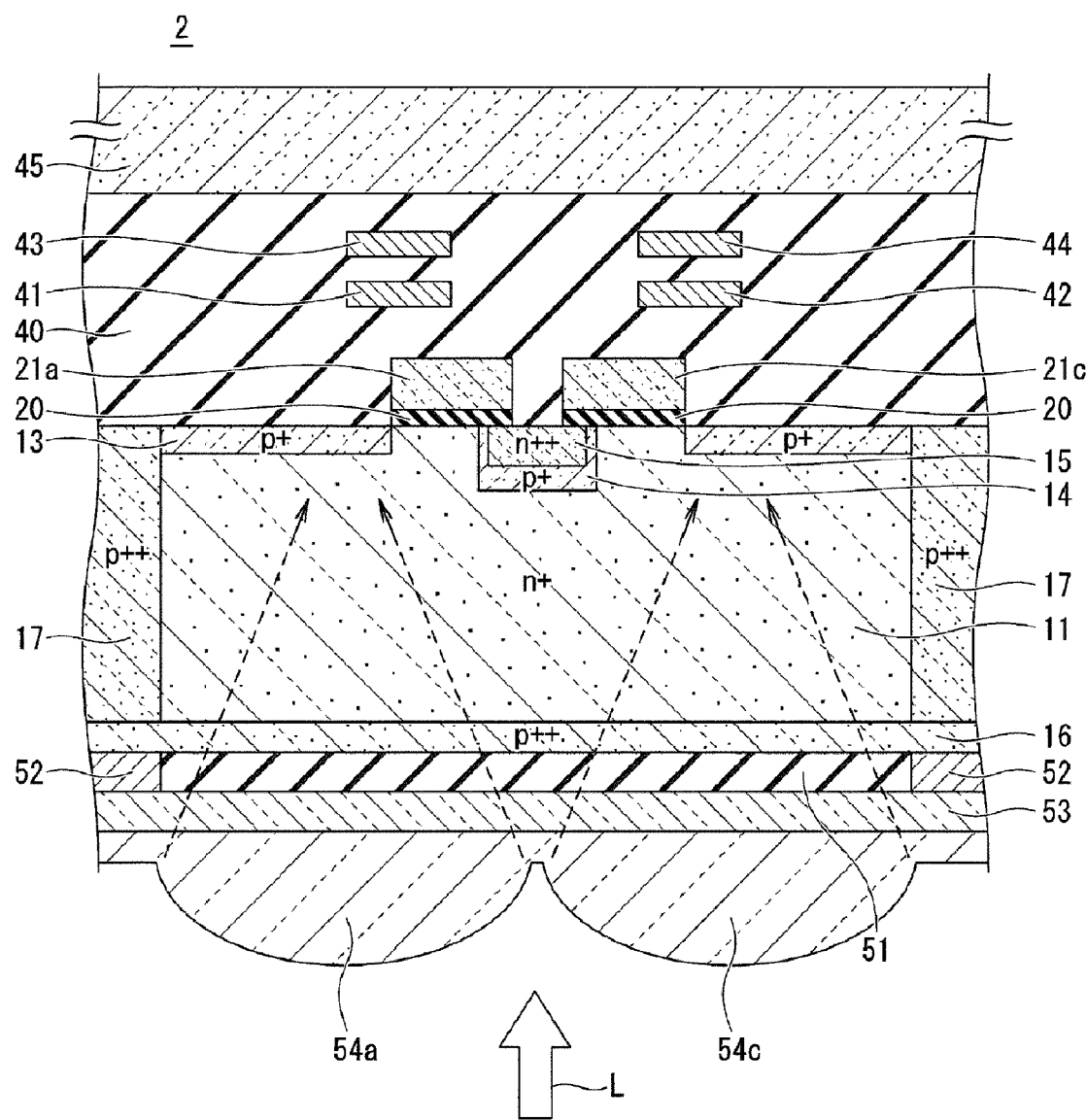
FIG. 8 is a cross-sectional view as viewed in direction A-A in FIG. 7.

In view of the above, as depicted in FIGS. 7 and 8, a solid-state imaging device according to a second embodiment is different from the solid-state imaging device according to the first embodiment depicted in FIG. 3 in that the pixel 2 includes a plurality of on-chip lenses 54a to 54d in a single photoelectric conversion region. FIG. 7 depicts a planar layout of the pixel 2, and FIG. 8 depicts a cross-sectional view as viewed in direction A-A in FIG. 7. In FIG. 7, positions of the on-chip lenses 54a to 54d are schematically depicted by broken lines. As depicted in FIG. 7, the on-chip lenses 54a to 54d are arranged in two rows and two columns so as to surround the periphery of the floating diffusion region 15. Other configurations of the solid-state imaging device according to the second embodiment are similar to those of the solid-state imaging device according to the first embodiment. Accordingly, redundant description will be omitted.

According to the solid-state imaging device of the second embodiment, the plurality of on-chip lenses 54a to 54d is formed on the single photoelectric conversion region. Therefore, it is possible to reduce the light condensing ratio on the floating diffusion region 15, and to reduce the efficiency of photoelectric conversion in the floating diffusion region 15. Therefore, it is possible to suppress a decrease in the dynamic range and an increase in noise due to photoelectric conversion in the floating diffusion region 15.

Third Embodiment

As a solid-state imaging device according to a third embodiment, derivative structures of a planar layout of the pixel 2 will be described with reference to FIGS. 9 to 11. Note that the configurations of the solid-state imaging device according to the third embodiment other than that of the pixel 2 are similar to those of the solid-state imaging device according to the first embodiment. Accordingly, redundant description will be omitted.

Figure 9:
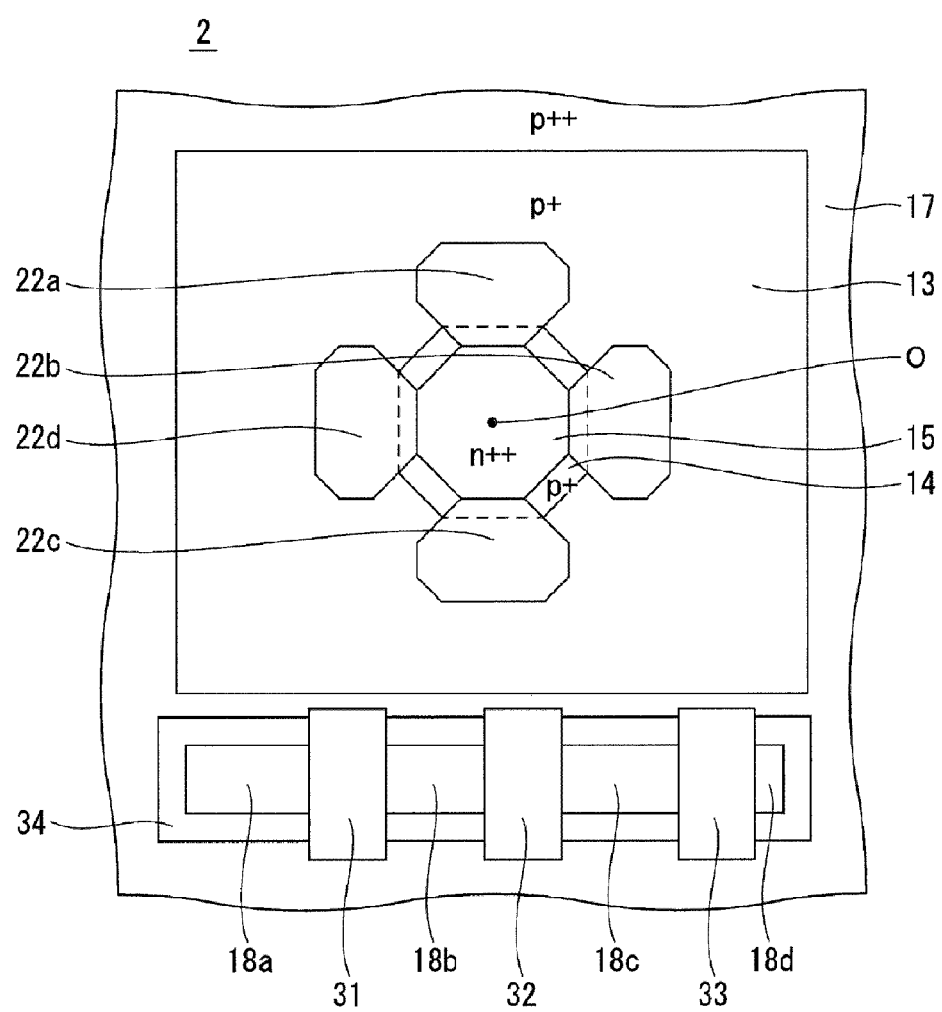
FIG. 9 is a plan view of a pixel according to a third embodiment.

The pixel 2 depicted in FIG. 9 includes four transfer gate electrodes 22a to 22d arranged in four-fold rotational symmetry about the floating diffusion region 15. The transfer gate electrodes 22a to 22d have a structure in which the transfer gate electrodes 21a to 21d of the solid-state imaging device according to the first embodiment depicted in FIG. 3 are rotated by 45°.

Figure 10:
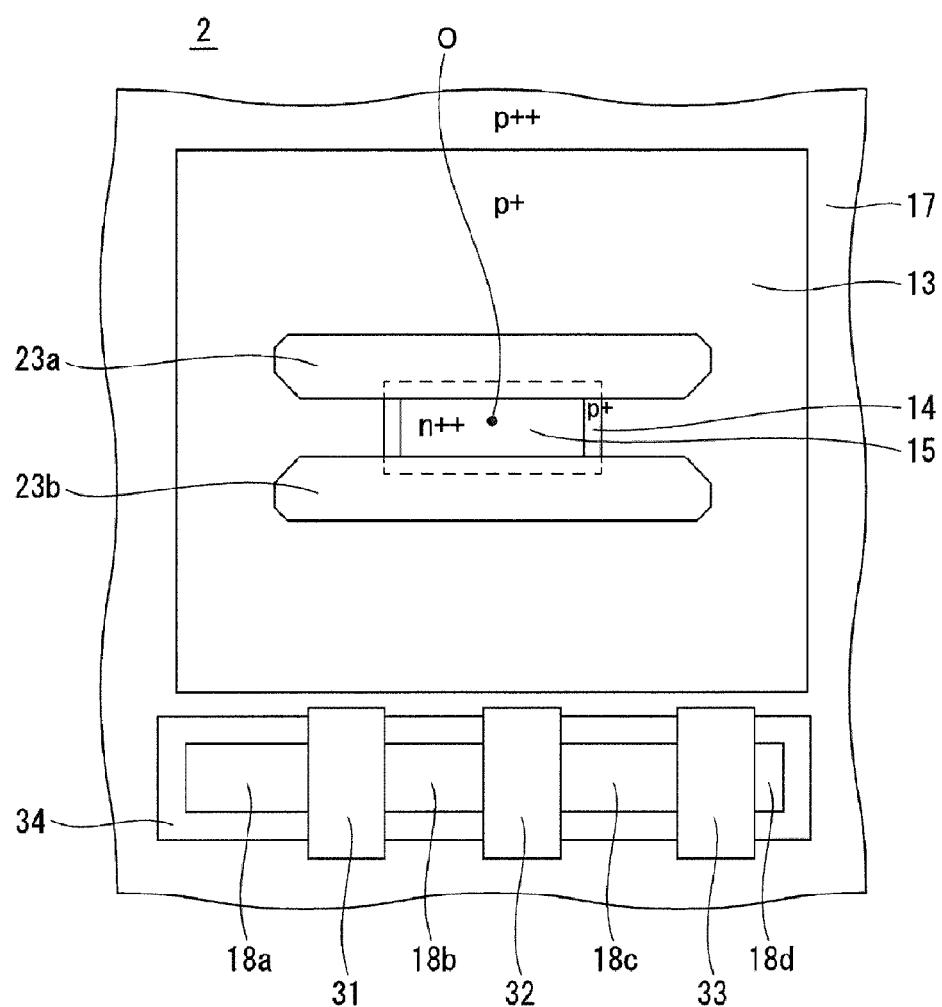
FIG. 10 is another plan view of the pixel according to the third embodiment.

The pixel 2 depicted in FIG. 10 includes two transfer gate electrodes 23a and 23b by reducing the number of electrodes as compared with the transfer gate electrodes 21a to 21d of the solid-state imaging device according to the first embodiment depicted in FIG. 3. The transfer gate electrodes 23a and 23b have a stripe-shaped planar pattern, and extend in parallel to each other with the floating diffusion region 15 interposed therebetween. The transfer gate electrodes 23a and 23b are arranged in line symmetry with the floating diffusion region 15 interposed therebetween, and in two-fold symmetry about the floating diffusion region 15. The floating diffusion region 15 has a substantially rectangular planar pattern.

Figure 11:
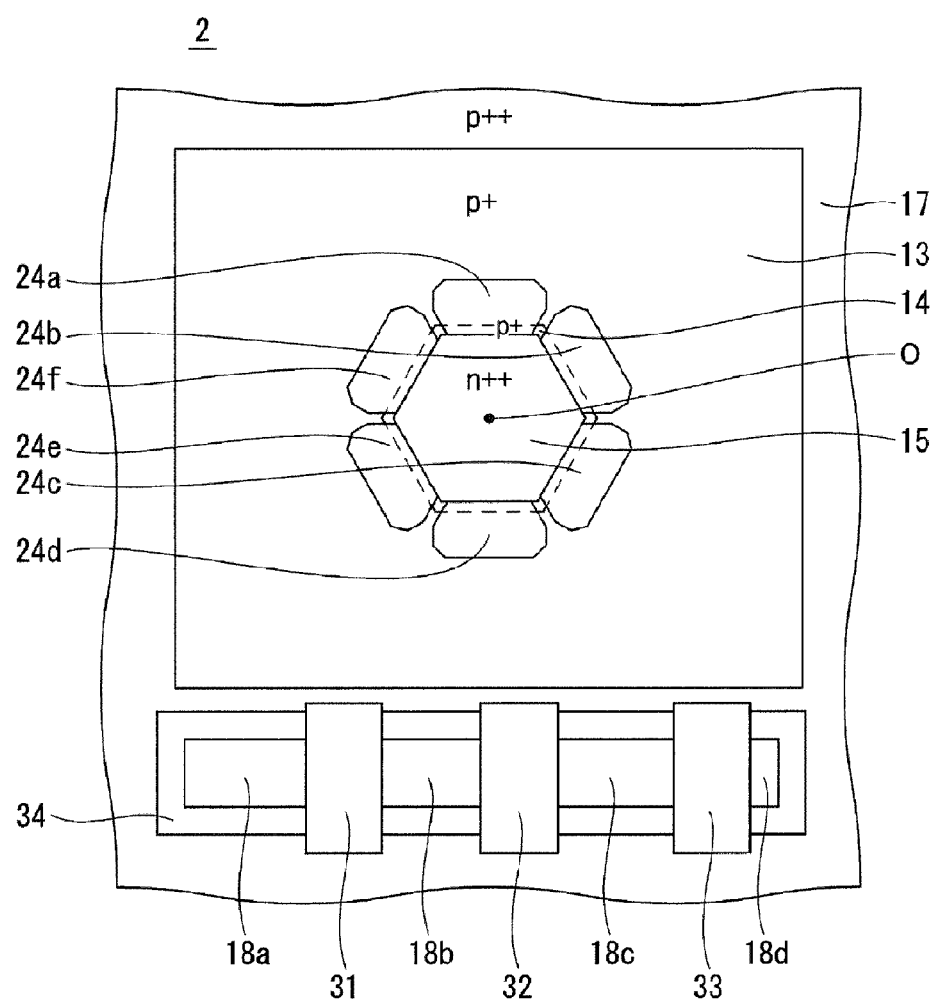
FIG. 11 is another plan view of the pixel according to the third embodiment.

The pixel 2 depicted in FIG. 11 includes six transfer gate electrodes 24a to 24f by increasing the number of electrodes as compared with the transfer gate electrodes 21a to 21d of the solid-state imaging device according to the first embodiment depicted in FIG. 3. The transfer gate electrodes 24a to 24f are arranged so as to surround the periphery of the floating diffusion region 15, and in six-fold rotational symmetry about the floating diffusion region 15. The floating diffusion region 15 has a substantially hexagonal planar pattern.

According to the solid-state imaging device of the third embodiment, various derivative structures can be applicable as long as it is a structure in which the plurality of transfer gate electrodes 22a to 22d, 23a and 23b, or 24a to 24f is arranged symmetrically about the floating diffusion region 15. That is, by arranging the plurality of transfer gate electrodes 22a to 22d, 23a and 23b, or 24a to 24f symmetrically about the floating diffusion region 15, the optical symmetry can be improved, so that the light can be efficiently extracted similarly to the solid-state imaging device according to the first embodiment.

Note that, since the transfer efficiency can be improved as intervals between the plurality of transfer gate electrodes are narrower and widths of the plurality of transfer gate electrodes are wider, it is preferable to arrange the plurality of transfer gate electrodes so as to narrow the intervals between the plurality of transfer gate electrodes to the processing limit.

Fourth Embodiment

Figure 12:
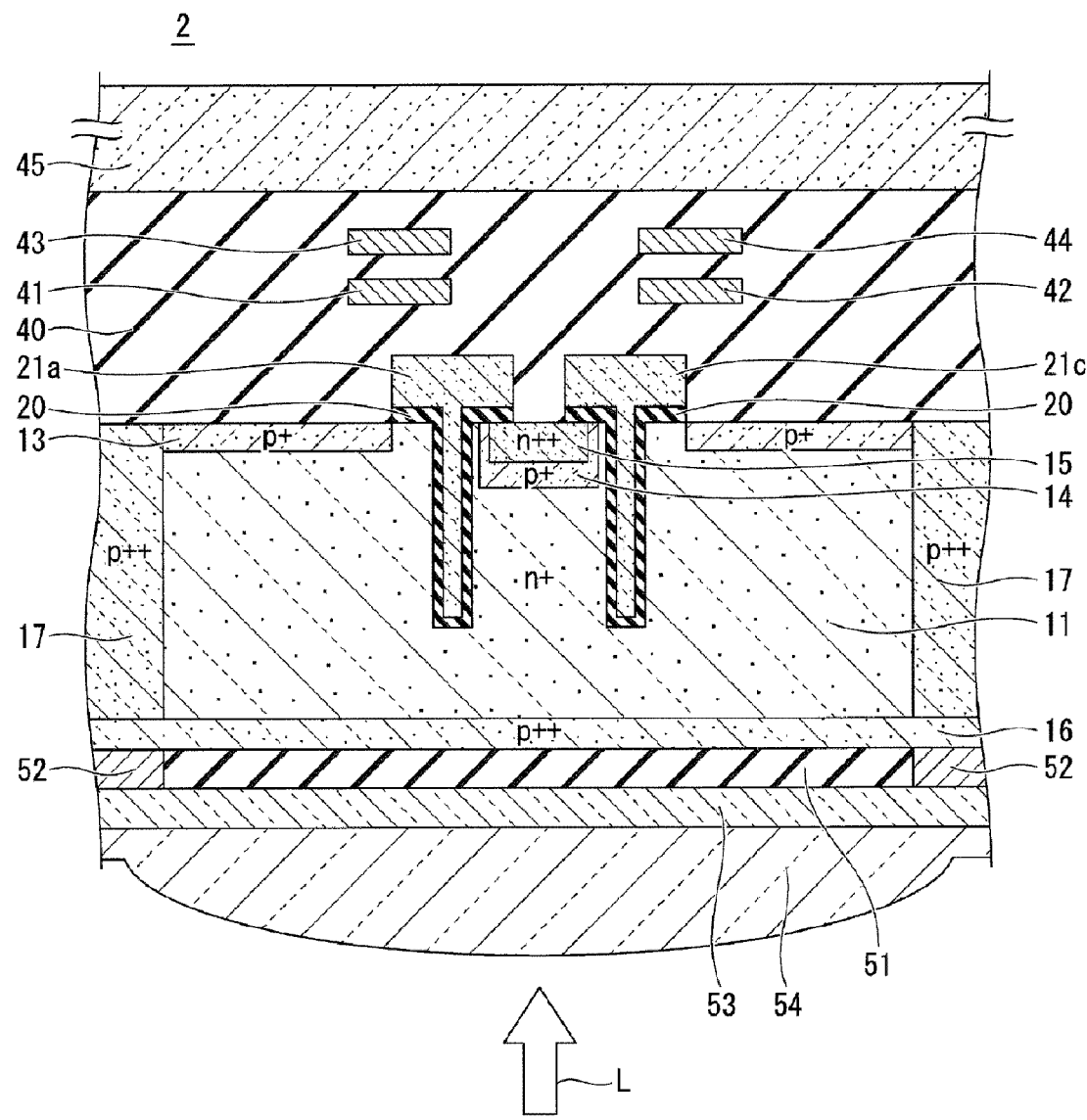
FIG. 12 is a cross-sectional view of a pixel according to a fourth embodiment.

As depicted in FIG. 12, a solid-state imaging device according to a fourth embodiment is different from the solid-state imaging device according to the first embodiment depicted in FIG. 4 in that the transfer gate electrodes 21a and 21c have an embedded structure (trench gate structure). The pixel 2 of the solid-state imaging device according to the fourth embodiment has a planar pattern similar to that of the solid-state imaging device according to the first embodiment depicted in FIG. 3, and although not depicted in FIG. 12, the transfer gate electrodes 21b and 21d also have an embedded structure. The cross-sectional view of the solid-state imaging device according to the fourth embodiment taken along direction A-A in FIG. 3 is similar to FIG. 5. Other configurations of the solid-state imaging device according to the fourth embodiment are similar to those of the solid-state imaging device according to the first embodiment. Accordingly, redundant description will be omitted.

According to the solid-state imaging device of the fourth embodiment, the transfer gate electrodes 21a to 21d have the embedded structure. Therefore, it is possible to modulate up to the semiconductor region 11 below the well region 14, so that transfer characteristics in the vertical direction can be improved.

Fifth Embodiment

Figure 13:
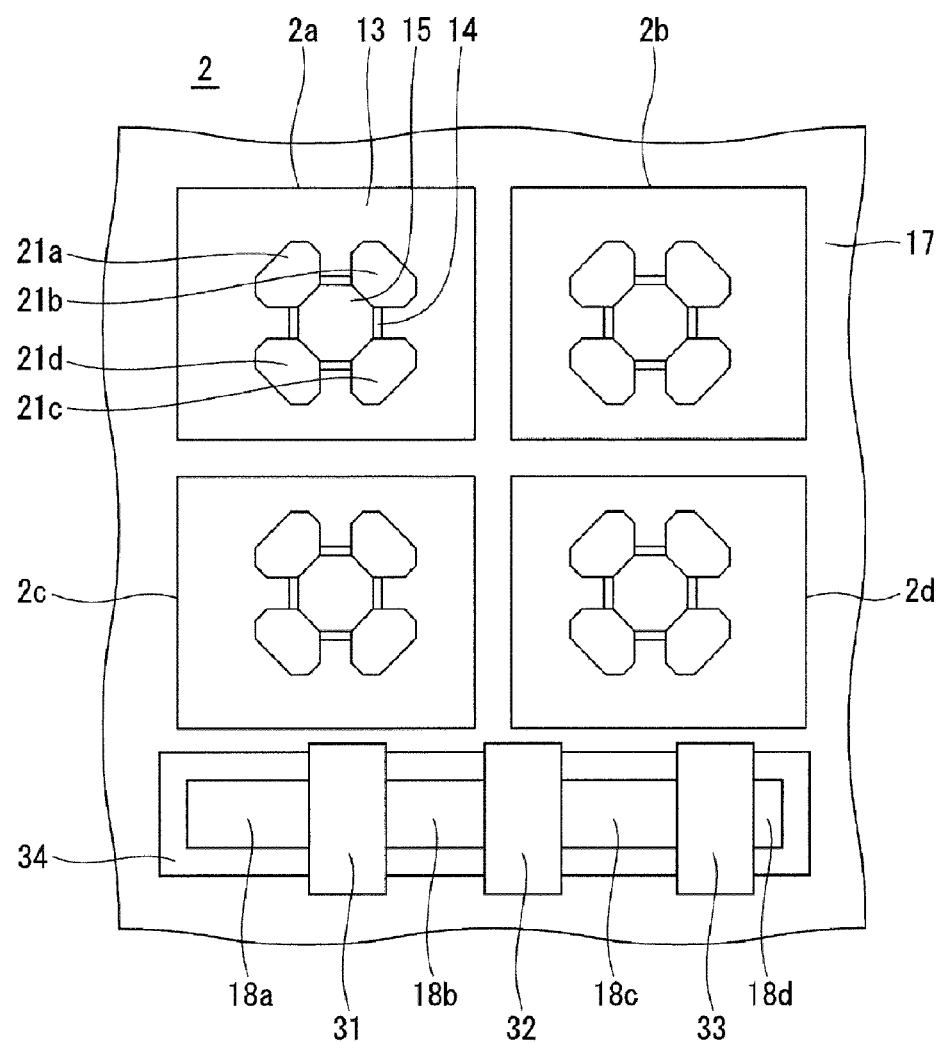
FIG. 13 is a plan view of a pixel according to a fifth embodiment.

As depicted in FIG. 13, a solid-state imaging device according to a fifth embodiment is different from the solid-state imaging device according to the first embodiment depicted in FIG. 3 in that the pixel 2 has a pixel sharing structure. The pixel 2 includes a plurality of (four) unit pixels 2a to 2d. Similarly to the pixel 2 of the solid-state imaging device according to the first embodiment depicted in FIG. 3, each of the unit pixels 2a to 2d includes the floating diffusion region 15, the plurality of transfer gate electrodes 21a to 21d provided so as to surround the periphery of the floating diffusion region 15. The respective floating diffusion regions 15 of the unit pixels 2a to 2d are read out by a shared pixel transistor. Other configurations of the solid-state imaging device according to the fifth embodiment are similar to those of the solid-state imaging device according to the first embodiment. Accordingly, redundant description will be omitted.

According to the solid-state imaging device of the fifth embodiment, the pixel 2 has the pixel sharing structure, and includes the plurality of unit pixels 2a to 2d. Therefore, the plurality of unit pixels 2a to 2d can be efficiently spread.

Sixth Embodiment

Figure 14:
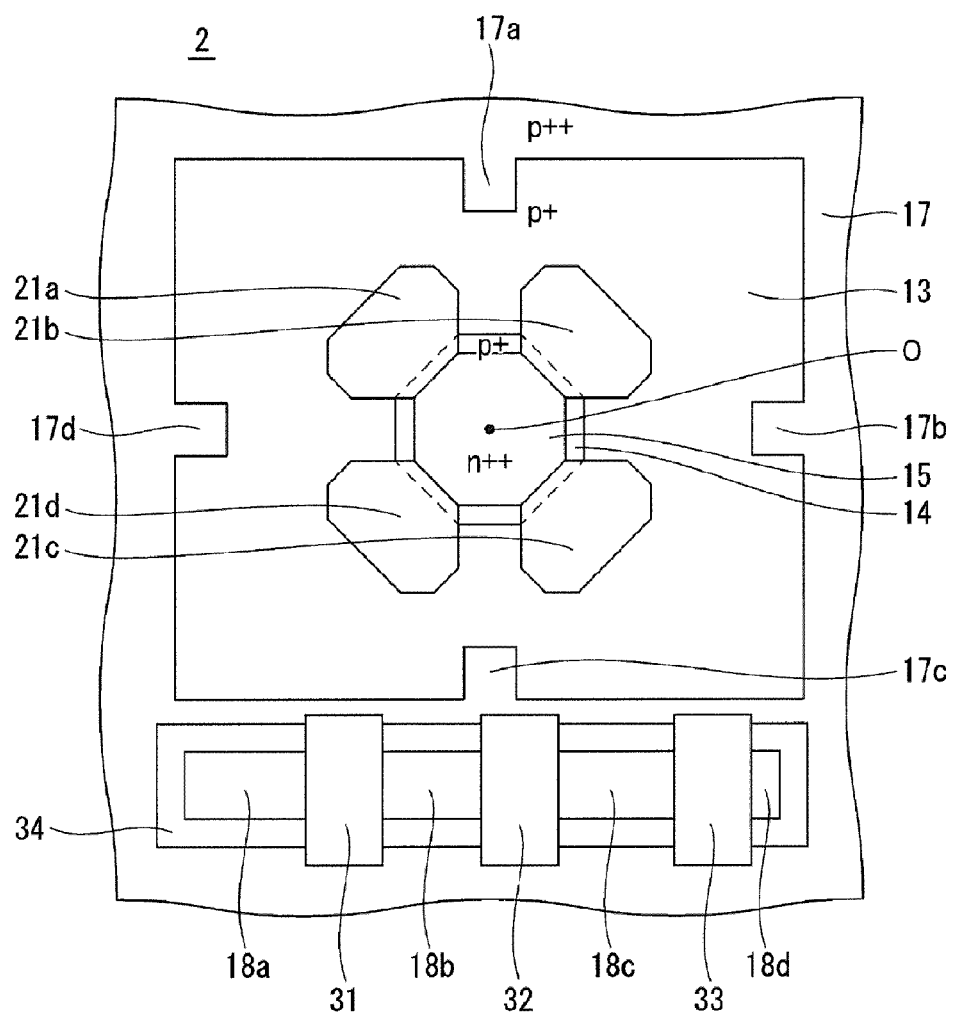
FIG. 14 is a plan view of a pixel according to a sixth embodiment.

As depicted in FIG. 14, a solid-state imaging device according to a sixth embodiment is different from the solid-state imaging device according to the first embodiment depicted in FIG. 3 in that the element isolation region 17 that defines the photoelectric conversion region includes a plurality of protruding portions 17a to 17d on the planar pattern. The protruding portions 17a to 17d are arranged at the center positions of the respective sides of the element isolation region 17. The arrangement positions of the protruding portions 17a to 17d are not particularly limited. The number of protruding portions 17a to 17d is not limited, and one to three protruding portions may be included, or five or more protruding portions may be included. Other configurations of the solid-state imaging device according to the sixth embodiment are similar to those of the solid-state imaging device according to the first embodiment. Accordingly, redundant description will be omitted.

According to the solid-state imaging device of the sixth embodiment, the planar pattern of the element isolation region 17 includes the protruding portions 17a to 17d. Therefore, the capacitance of the side wall of the element isolation region 17 can be increased, so that the saturation signal charge amount can be increased.

Other Embodiments

As described above, the present technology has been described according to the first to sixth embodiments, but it should be understood that the present technology is not limited by the statements and drawings constituting portions of the present disclosure. It will be apparent to those skilled in the art that various alternative embodiments, examples, and operational technologies can be included in the present technology if the concept of the content of the technology disclosed by the above-described embodiments is understood. Furthermore, the configurations disclosed in the first to sixth embodiments can be suitably combined within a range in which no contradiction occurs.

Furthermore, application examples of the present disclosure include an infrared light receiving element, an imaging device and an electronic device that use the infrared light receiving element, and the like, and as use applications, in addition to a normal camera and a smartphone, a wide variety of applications to imaging and sensing are conceivable, such as a surveillance camera, a camera for industrial devices such as factory inspection, a vehicle-mounted camera, a distance measuring sensor (ToF sensor), and an infrared sensor. An example thereof will be described below.

<Electronic Device>

Figure 15:
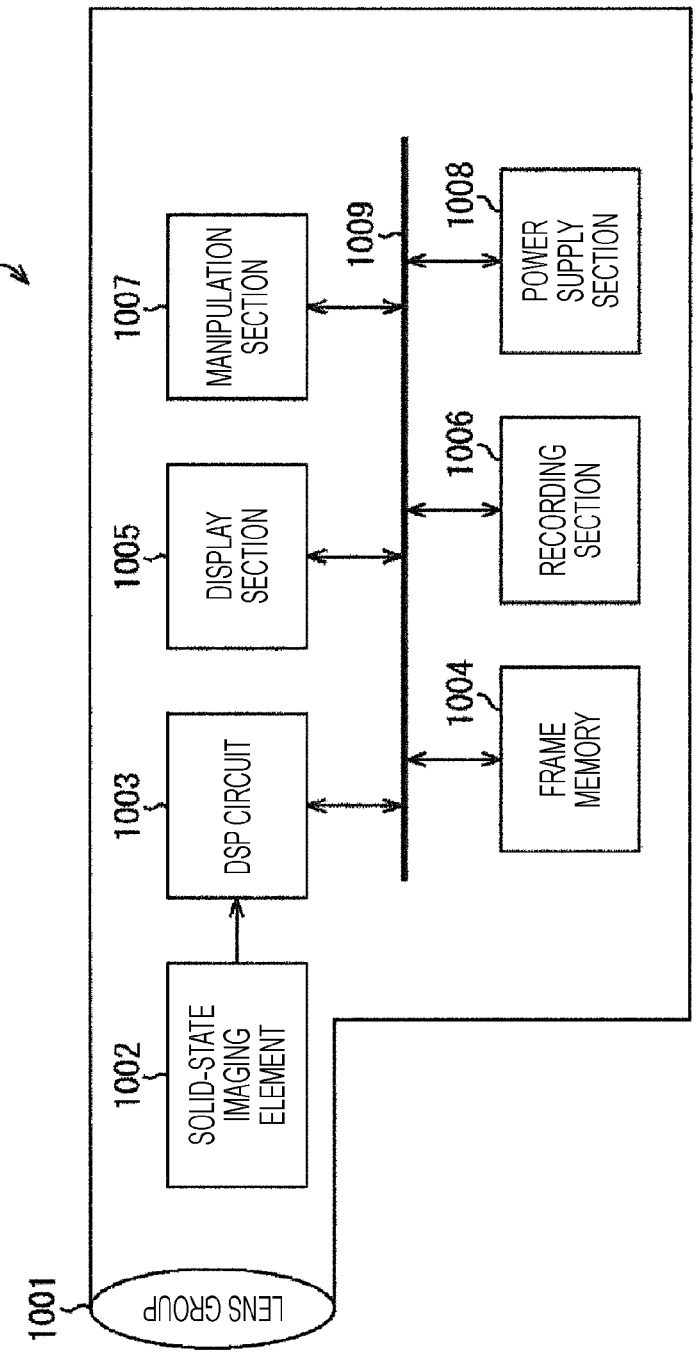
FIG. 15 is a block diagram depicting a configuration example of an imaging device as an electronic device to which the present disclosure is applied.

FIG. 15 is a block diagram depicting a configuration example of an embodiment of an imaging device as an electronic device to which the present disclosure is applied.

An imaging device 1000 in FIG. 15 is a video camera, a digital still camera, or the like. The imaging device 1000 includes a lens group 1001, a solid-state imaging element 1002, a DSP circuit 1003, a frame memory 1004, a display section 1005, a recording section 1006, a manipulation section 1007, and a power supply section 1008. The DSP circuit 1003, the frame memory 1004, the display section 1005, the recording section 1006, the manipulation section 1007, and the power supply section 1008 are connected to each other via a bus line 1009.

The lens group 1001 takes incident light (image light) from a subject therein, and forms an image on an imaging surface of the solid-state imaging element 1002. The solid-state imaging element 1002 includes the above-described CMOS image sensor according to the first to third embodiments. The solid-state imaging element 1002 converts the light amount of the incident light formed as an image on the imaging surface by the lens group 1001 into an electric signal in the unit of pixel, and supplies the electric signal as a pixel signal to the DSP circuit 1003.

The DSP circuit 1003 performs a predetermined image process for the pixel signal supplied from the solid-state imaging element 1002, supplies the image signal after the image process to the frame memory 1004 in the unit of frame and makes the frame memory 1004 temporarily store the image signal.

The display section 1005 includes, for example, a panel type display apparatus such as a liquid crystal panel or an organic electro luminescence (EL) panel, and displays an image on the basis of the pixel signal in the unit of frame temporarily stored in the frame memory 1004.

The recording section 1006 includes a digital versatile disk (DVD), a flash memory, or the like, and reads out and records the pixel signal in the unit of frame temporarily stored in the frame memory 1004.

The manipulation section 1007 issues manipulation commands for various functions that the imaging device 1000 has under the manipulation by a user. The power supply section 1008 suitably supplies power to the DSP circuit 1003, the frame memory 1004, the display section 1005, the recording section 1006, and the manipulation section 1007.

The electronic device to which the present technology is applied is only required to be a device using a CMOS image sensor in an image capturing section (photoelectric conversion section), and includes a mobile terminal device having an imaging function, a copier using a CMOS image sensor in an image reading section, and the like, in addition to the imaging device 1000.

<Application Example to Endoscopic Surgery System>

The technology according to the present disclosure (present technology) can be applied to various products. For example, the technology according to the present disclosure may be applied to an endoscopic surgery system.

Figure 16:
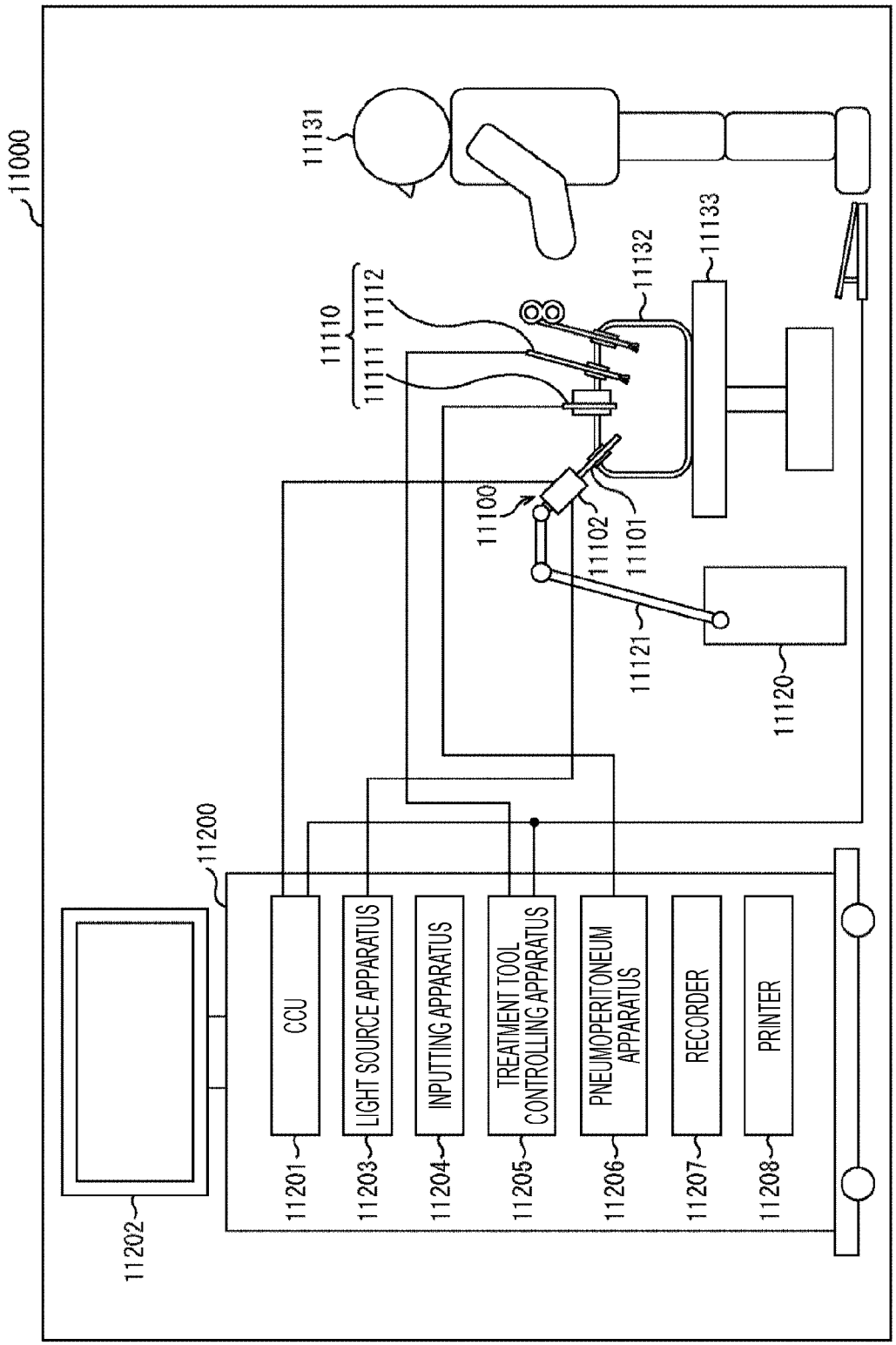
FIG. 16 is a view depicting an example of a schematic configuration of an endoscopic surgery system.

FIG. 16 is a view depicting an example of a schematic configuration of an endoscopic surgery system to which the technology according to the present disclosure (present technology) can be applied.

In FIG. 16, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 17:
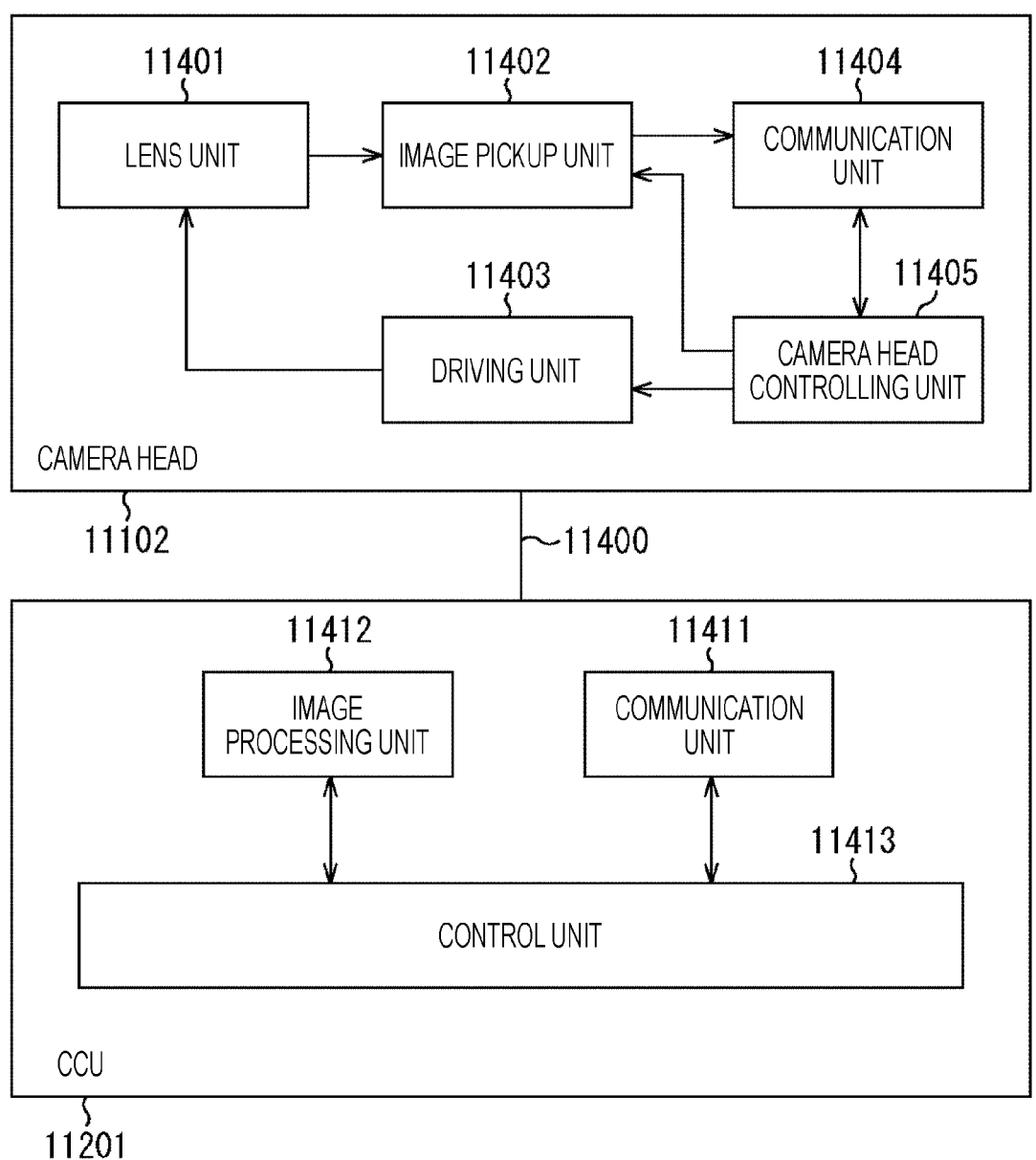
FIG. 17 is a block diagram depicting an example of a functional configuration of a camera head and a camera control unit (CCU).

FIG. 17 is a block diagram depicting an example of a functional configuration of the camera head 11102 and the CCU 11201 depicted in FIG. 16.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The present technology can be applied to the image pickup unit 11402 among the configurations described above. By applying the present technology to the image pickup unit 11402, it is possible to obtain a clearer image of the surgical region, so that the surgeon can confirm the surgical region with certainty.

Note that the endoscopic surgery system has been described as an example here, but other than the endoscopic surgery system, the present technology may be applied to a microscopic surgery system and the like, for example.

<Application Example to Mobile Body>

The technology according to the present disclosure (present technology) can be applied to various products. For example, the technology according to the present disclosure may be implemented as a device included in any type of mobile body such as an automobile, an electric vehicle, a hybrid electric vehicle, a motorcycle, a bicycle, a personal mobility, an airplane, a drone, a ship, a robot, or the like.

Figure 18:
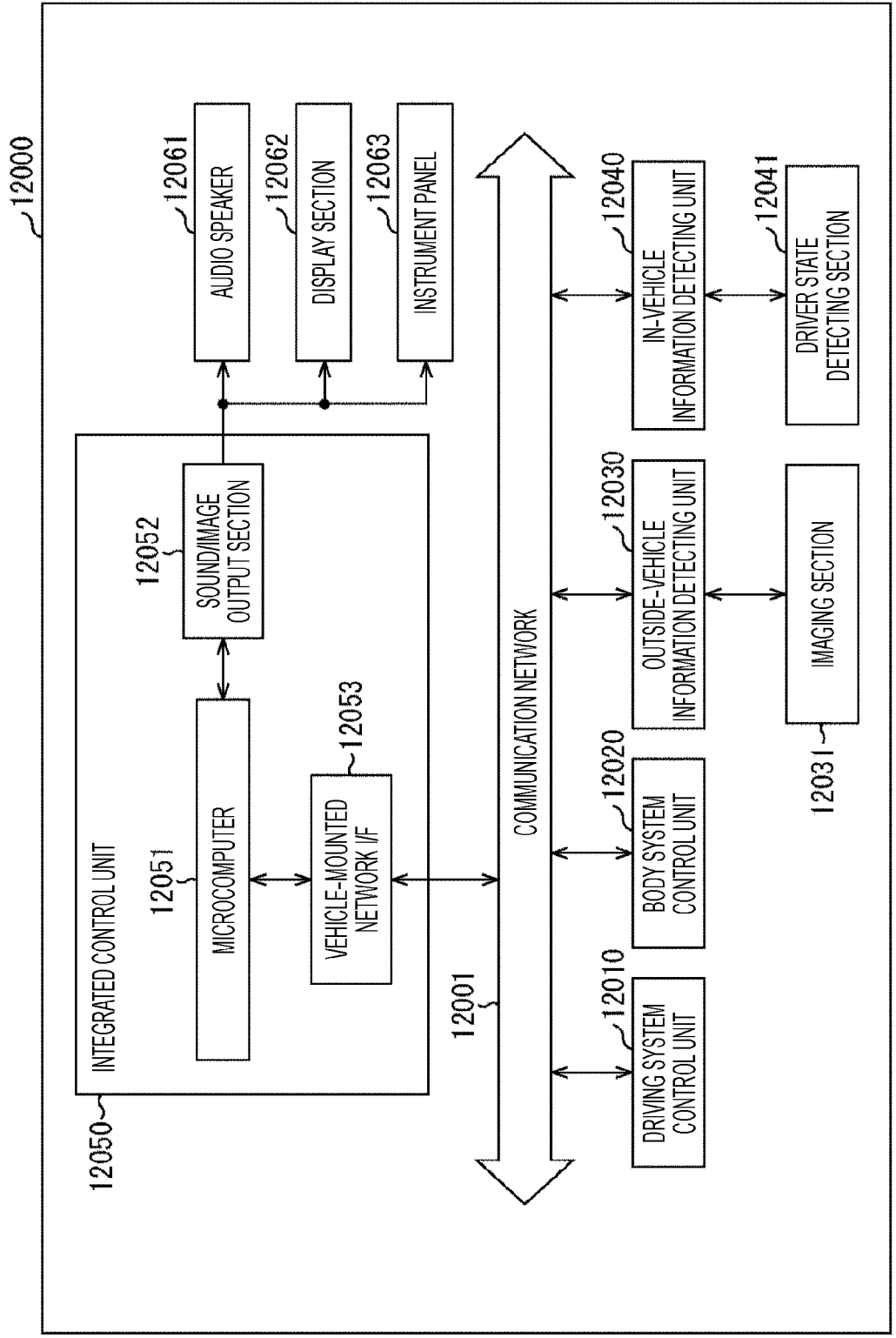
FIG. 18 is a block diagram depicting an example of a schematic configuration of a vehicle control system.

FIG. 18 is a block diagram depicting an example of a schematic configuration of a vehicle control system as an example of a mobile body control system to which the technology according to the present disclosure can be applied.

The vehicle control system 12000 includes a plurality of electronic control units connected to each other via a communication network 12001. In the example depicted in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 18, an audio speaker 12061, a display section 12062, and an instrument panel

12063 are illustrated as the output device. The display section 12062 may, for example, include at least one of an on-board display and a head-up display.

Figure 19:
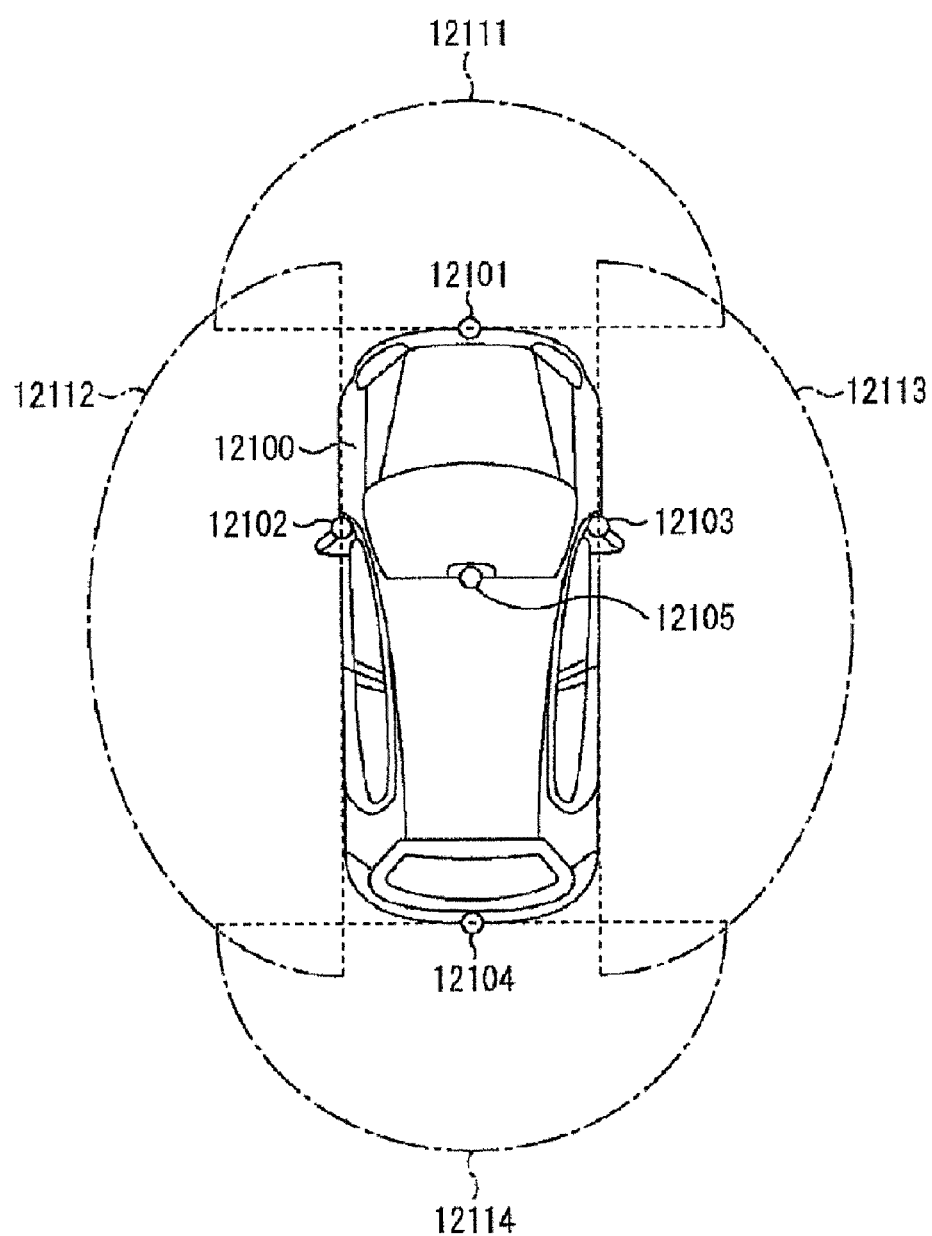
FIG. 19 is a diagram of assistance in explaining an example of installation positions of an outside-vehicle information detecting section and an imaging section.

FIG. 19 is a diagram depicting an example of the installation position of the imaging section 12031.

In FIG. 19, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 19 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the present technology can be applied has been described above. The present technology can be applied to the imaging section 12031 among the configurations described above. By applying the technology according to the present disclosure to the imaging section 12031, it is possible to obtain a more easily viewable photographed image, so that fatigue of the driver can be reduced.

Moreover, the solid-state imaging device according to the present technology can also be applied to electronic devices such as a surveillance camera, a biometric authentication system, and thermography. The surveillance camera is of, for example, a night vision system (night vision). By applying the solid-state imaging device to the surveillance camera, it is possible to recognize a pedestrian, an animal, and the like at night from a distance. Furthermore, by applying the solid-state imaging device to a vehicle-mounted camera, it is hardly affected by headlights or weather. For example, it is possible to obtain a photographed image without being affected by smoke, fog, or the like. Moreover, it is possible to recognize a shape of an object. Furthermore, thermography enables contactless temperature measurement. Thermography also enables detection of temperature distribution and heat generation. In addition, the solid-state imaging device can also be applied to an electronic device that detects fire, water, gas, or the like.

Note that the present technology can have the following configurations.

(1)

A light receiving element including:
a photoelectric conversion region that constitutes a pixel;
a floating diffusion region of a first conductivity type that is provided on one main surface side of the photoelectric conversion region; and
a plurality of transfer gate electrodes that is provided to be spaced apart from each other on one main surface of the photoelectric conversion region with a gate insulating film interposed between the photoelectric conversion region and the plurality of transfer gate electrodes, the plurality of transfer gate electrodes being provided symmetrically about the floating diffusion region on a planar pattern.

(2)

The light receiving element according to the (1), further including
a well region of a second conductivity type that is provided on the one main surface side of the photoelectric conversion region, the well region surrounding a periphery of the floating diffusion region, and being in contact with the floating diffusion region.

(3)

The light receiving element according to the (2),
in which the photoelectric conversion region includes:
a first semiconductor region of a first conductivity type; and
a second semiconductor region of a second conductivity type that is provided on the one main surface side of the first semiconductor region, the second semiconductor region being in contact with the first semiconductor region so as to surround a periphery of the well region.

(4)

The light receiving element according to the (3),
in which the second semiconductor region is in contact with the well region through between the plurality of transfer gate electrodes on the planar pattern.

(5)

The light receiving element according to any one of the (1) to (4),
in which the floating diffusion region is provided at a center of the photoelectric conversion region on the planar pattern.

(6)

The light receiving element according to any one of the (1) to (5),
in which the plurality of gate electrodes is connected to a common transfer control wiring line.

(7)

The light receiving element according to any one of the (1) to (6), further including
a plurality of on-chip lenses that is provided on another main surface side of the photoelectric conversion region.

(8)

The light receiving element according to the (7),
in which the plurality of on-chip lenses is provided so as to surround a periphery of the floating diffusion region on the planar pattern.

(9)

The light receiving element according to any one of the (1) to (8),
in which the plurality of transfer gate electrodes includes four transfer gate electrodes that are provided in four-fold symmetry about the floating diffusion region.

(10)

The light receiving element according to any one of the (1) to (8),
in which the plurality of transfer gate electrodes includes two transfer gate electrodes that are provided in two-fold symmetry about the floating diffusion region.

(11)

The light receiving element according to any one of the (1) to (8),
in which the plurality of transfer gate electrodes includes six transfer gate electrodes that are provided in six-fold symmetry about the floating diffusion region.

(12)

The light receiving element according to any one of the (1) to (11),
in which each of the plurality of transfer gate electrodes has an embedded structure.

(13)

The light receiving element according to any one of the (1) to (12),
in which the pixel includes a plurality of unit pixels each including the photoelectric conversion region, the floating diffusion region, and the plurality of transfer gate electrodes.

(14)

The light receiving element according to any one of the (1) to (13),
in which an element isolation region that defines the photoelectric conversion region includes a protruding portion that protrudes toward an inner side of the photoelectric conversion region on the planar pattern.

(15)

A solid-state imaging device including
a pixel region that includes a plurality of pixels arrayed in a matrix,
in which each of the pixels includes:
a photoelectric conversion region;
a floating diffusion region of a first conductivity type that is provided on one main surface side of the photoelectric conversion region; and
a plurality of transfer gate electrodes that is provided to be spaced apart from each other on one main surface of the photoelectric conversion region with a gate insulating film interposed between the photoelectric conversion region and the plurality of transfer gate electrodes, the plurality of transfer gate electrodes being provided symmetrically about the floating diffusion region on a planar pattern.

(16)

An electronic device including:
a solid-state imaging device that includes a pixel region including a plurality of pixels arrayed in a matrix; and
a signal processing circuit that processes an output signal of the solid-state imaging device,
in which each of the pixels includes:
a photoelectric conversion region;
a floating diffusion region of a first conductivity type that is provided on one main surface side of the photoelectric conversion region; and
a plurality of transfer gate electrodes that is provided to be spaced apart from each other on one main surface of the photoelectric conversion region with a gate insulating film interposed between the photoelectric conversion region and the plurality of transfer gate electrodes, the plurality of transfer gate electrodes being provided symmetrically about the floating diffusion region on a planar pattern.

REFERENCE SIGNS LIST

1 Substrate
2 Pixel
2a to 2d Unit pixel
3 Pixel region (imaging region)
4 Vertical driving circuit
5 Column signal processing circuit
6 Horizontal driving circuit
7 Output circuit
8 Control circuit
9 Vertical signal line
10 Horizontal signal line
11 Semiconductor region
12 Input/output terminal
13 Semiconductor region
14 Well region
15 Floating diffusion region
16 Semiconductor region
17 Element isolation region
17a to 17d Protruding portion
18a to 18d Diffusion region
20 Gate insulating film
21a to 21d, 22a to 22d, 23a, 23b, 24a to 24f Transfer gate electrode
31, 32, 33 Gate electrode
34 Element isolation insulating film
40 Interlayer insulating film
41 to 44 Wiring line layer
45 Support substrate
51 Planarization film
52 Light shielding film
53 Color filter
54, 54a to 54d On-chip lens
61a to 61d Gate wiring line
62 Readout wiring line
63 Transfer control wiring line
1000 Imaging device
1001 Lens group
1002 Solid-state imaging element
1003 DSP circuit
1004 Frame memory
1005 Display section
1006 Recording section
1007 Manipulation section
1008 Power supply section
1009 Bus line
11000 Endoscopic surgery system
11100 Endoscope
11101 Lens barrel
11102 Camera head
11110 Surgical tool
11111 Pneumoperitoneum tube
11112 Energy device
11120 Supporting arm apparatus
11131 Surgeon
11132 Patient
11133 Patient bed
11200 Cart
11202 Display apparatus
11203 Light source apparatus
11204 Inputting apparatus
11205 Treatment tool controlling apparatus
11206 Pneumoperitoneum apparatus
11207 Recorder
11208 Printer
11400 Transmission cable
11401 Lens unit
11402 Image pickup unit
11403 Driving unit
11404 Communication unit
11405 Camera head controlling unit
11411 Communication unit
11412 Image processing unit
11413 Control unit
12000 Vehicle control system
12001 Communication network
12010 Driving system control unit
12020 Body system control unit
12030 Outside-vehicle information detecting unit
12030 Body system control unit
12031 Imaging section
12040 In-vehicle information detecting unit
12041 Driver state detecting section
12050 Integrated control unit
12051 Microcomputer
12052 Sound/image output section
12061 Audio speaker
12062 Display section
12063 Instrument panel
12100 Vehicle
12101 to 12105 Image pickup unit
12111 to 12114 Imaging range
FD Floating diffusion region
PD Photodiode
T1 Transfer transistor
T2 Reset transistor
T3 Amplification transistor
T4 Selection transistor

The invention claimed is:

1. A light receiving element, comprising:
a photoelectric conversion region that constitutes a pixel;
a floating diffusion region of a first conductivity type that is on a first surface side of the photoelectric conversion region;
a plurality of transfer gate electrodes on the first surface side of the photoelectric conversion region, wherein
a first transfer gate electrode of the plurality of transfer gate electrodes is spaced apart from a second transfer gate electrode of the plurality of transfer gate electrodes; and
a gate insulating film between the photoelectric conversion region and the plurality of transfer gate electrodes, wherein
the plurality of transfer gate electrodes are symmetrical about the floating diffusion region on a planar pattern.

2. The light receiving element according to claim 1, further comprising a well region of a second conductivity type that is on the first surface side of the photoelectric conversion region, wherein
the well region surrounds a periphery of the floating diffusion region, and
the well region is in contact with the floating diffusion region.

3. The light receiving element according to claim 2, wherein
the photoelectric conversion region includes:
a first semiconductor region of the first conductivity type; and
a second semiconductor region of the second conductivity type that is on a first surface side of the first semiconductor region, wherein the second semiconductor region is in contact with the first semiconductor region so as to surround a periphery of the well region.

4. The light receiving element according to claim 3, wherein the second semiconductor region is in contact with the well region through between the plurality of transfer gate electrodes on the planar pattern.

5. The light receiving element according to claim 1, wherein the floating diffusion region is at a center of the photoelectric conversion region on the planar pattern.

6. The light receiving element according to claim 1, wherein the plurality of transfer gate electrodes are connected to a common transfer control wiring line.

7. The light receiving element according to claim 1, further comprising a plurality of on-chip lenses that are on a second surface side of the photoelectric conversion region.

8. The light receiving element according to claim 7, wherein the plurality of on-chip lenses surrounds a periphery of the floating diffusion region on the planar pattern.

9. The light receiving element according to claim 1, wherein the plurality of transfer gate electrodes includes four transfer gate electrodes that are in four-fold symmetry about the floating diffusion region.

10. The light receiving element according to claim 1, wherein the plurality of transfer gate electrodes includes two transfer gate electrodes that are in two-fold symmetry about the floating diffusion region.

11. The light receiving element according to claim 1, wherein the plurality of transfer gate electrodes includes six transfer gate electrodes that are in six-fold symmetry about the floating diffusion region.

12. The light receiving element according to claim 1, wherein each of the plurality of transfer gate electrodes has an embedded structure.

13. The light receiving element according to claim 1, wherein
the pixel includes a plurality of unit pixels, and
each of the plurality of unit pixels includes:
the photoelectric conversion region,
the floating diffusion region, and
the plurality of transfer gate electrodes.

14. The light receiving element according to claim 1, further comprising an element isolation region that defines the photoelectric conversion region, wherein
the element isolation region includes a protruding portion that protrudes toward an inner side of the photoelectric conversion region on the planar pattern.

15. A solid-state imaging device, comprising:
a pixel region that includes a plurality of pixels arrayed in a matrix, wherein each of the plurality of pixels includes:
a photoelectric conversion region;
a floating diffusion region of a first conductivity type that is on a first surface side of the photoelectric conversion region;
a plurality of transfer gate electrodes on the first surface side of the photoelectric conversion region, wherein
a first transfer gate electrode of the plurality of transfer gate electrodes is spaced apart from a second transfer gate electrode of the plurality of transfer gate electrodes; and
a gate insulating film between the photoelectric conversion region and the plurality of transfer gate electrodes, wherein
the plurality of transfer gate electrodes are symmetrical about the floating diffusion region on a planar pattern.

16. An electronic device, comprising:
a solid-state imaging device that includes a pixel region, wherein the pixel region includes a plurality of pixels arrayed in a matrix; and
a signal processing circuit configured to process an output signal of the solid-state imaging device, wherein each of the plurality of pixels includes:
a photoelectric conversion region;
a floating diffusion region of a first conductivity type that is on a first surface side of the photoelectric conversion region;
a plurality of transfer gate electrodes on the first surface side of the photoelectric conversion region, wherein
a first transfer gate electrode of the plurality of transfer gate electrodes is spaced apart from a second transfer gate electrode of the plurality of transfer gate electrodes; and
a gate insulating film between the photoelectric conversion region and the plurality of transfer gate electrodes, wherein
the plurality of transfer gate electrodes are symmetrical about the floating diffusion region on a planar pattern.

* * * * *